United States Patent
Iwaki et al.

(10) Patent No.: US 7,061,100 B2
(45) Date of Patent: Jun. 13, 2006

(54) SEMICONDUCTOR BUILT-IN MILLIMETER-WAVE BAND MODULE

(75) Inventors: Hideki Iwaki, Ibaraki (JP); Yutaka Taguchi, Takatsuki (JP); Tetsuyosi Ogura, Settsu (JP); Yasuhiro Sugaya, Toyonaka (JP); Toshiyuki Asahi, Osaka (JP); Tousaku Nishiyama, Nara (JP); Yoshinobu Idogawa, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/405,524

(22) Filed: Apr. 2, 2003

(65) Prior Publication Data

US 2003/0189246 A1    Oct. 9, 2003

(30) Foreign Application Priority Data

Apr. 3, 2002  (JP) ............................. 2002-100959

(51) Int. Cl.
*H01L 23/10* (2006.01)
*H01L 23/34* (2006.01)

(52) U.S. Cl. ..................... 257/706; 257/703; 257/522

(58) Field of Classification Search ............... 257/703, 257/706, 522
See application file for complete search history.

(56) References Cited

U.S. PATENT DOCUMENTS

| | | | |
|---|---|---|---|
| 5,401,687 A | * | 3/1995 | Cole et al. .................. 438/125 |
| 5,524,339 A | * | 6/1996 | Gorowitz et al. ............. 29/841 |
| 5,668,398 A | * | 9/1997 | Havemann et al. ......... 257/522 |
| 5,757,072 A | * | 5/1998 | Gorowitz et al. ........... 257/700 |
| 5,874,321 A | | 2/1999 | Templeton, Jr. et al. |
| 5,888,627 A | * | 3/1999 | Nakatani ..................... 428/209 |
| 6,038,133 A | | 3/2000 | Nakatani et al. |
| 6,057,600 A | | 5/2000 | Kitazawa et al. |

(Continued)

FOREIGN PATENT DOCUMENTS

| | | |
|---|---|---|
| EP | 0 920 058 | 2/1999 |
| JP | 10-284657 | 10/1998 |
| JP | 2856192 | 11/1998 |

(Continued)

*Primary Examiner*—Howard Weiss
(74) *Attorney, Agent, or Firm*—Hamre, Schumann, Mueller & Larson, P.C.

(57) ABSTRACT

A semiconductor built-in millimeter-wave band module includes: an insulating substrate made of a mixture containing an inorganic filler and a thermosetting resin; a high thermal conductivity substrate made of a dielectric material having thermal conductivity higher than the insulating substrate and laminated on one surface of the insulating substrate; a plurality of wiring patterns formed on the high thermal conductivity substrate and the insulating substrate; a semiconductor device operating at millimeter-wave band, which is arranged inside of the insulating substrate, is packaged on the high thermal conductivity substrate in a face-up manner, and is connected electrically with the wiring patterns; and a distributed constant circuit element and an active element provided on the semiconductor device. In this module, a void is provided inside of the insulating substrate and in the vicinity of a surface of the distributed constant circuit element and the active element. With this configuration, heat from the semiconductor device operating at a millimeter-wave band can be dissipated effectively and the semiconductor and other circuit components can be packaged with high density.

23 Claims, 12 Drawing Sheets

U.S. PATENT DOCUMENTS

| | | | |
|---|---|---|---|
| 6,501,016 B1* | 12/2002 | Sosnowski | 174/35 R |
| 6,538,210 B1* | 3/2003 | Sugaya et al. | 174/258 |
| 6,566,170 B1 | 5/2003 | Marion et al. | |
| 6,683,795 B1* | 1/2004 | Yoo | 361/816 |
| 6,710,449 B1* | 3/2004 | Hyoto et al. | 257/758 |
| 2001/0045010 A1* | 11/2001 | Hirabayashi | 29/846 |

FOREIGN PATENT DOCUMENTS

| | | |
|---|---|---|
| JP | 11-45955 | 2/1999 |
| JP | 11-220262 | 8/1999 |
| JP | 3051700 | 3/2000 |
| WO | 99/67818 | 12/1999 |

* cited by examiner

SEMICONDUCTOR BUILT-IN MILLIMETER-WAVE BAND MODULE

BACKGROUND OF THE INVENTION

1. Field of the Invention

The present invention relates to a semiconductor built-in millimeter-wave band module, and more particularly relates to a semiconductor built-in module in which a semiconductor device operating at a micrometer-wave band or a millimeter-wave band (hereinafter referred to as "semiconductor device operating at a millimeter-wave band") is arranged inside of an electrical insulating substrate.

2. Related Background Art

In recent years, with a demand for miniaturized electronic equipment having higher performance, circuit components with ever higher density and higher functionality have been demanded. To this end, a circuit board commensurate with the circuit components with higher density and higher functionality has been requested. Especially, as a method for packaging circuit components including a semiconductor device densely, a circuit component built-in module capable of including a semiconductor device therein is proposed by using an electrical insulating substrate (hereinafter also referred to as "insulating substrate") made of a mixture containing an inorganic filler and a thermosetting resin (JP 11(1999)-220262 A and JP-3051700 B).

Meanwhile, a package that allows heat generated from a semiconductor device operating at a millimeter-wave band to dissipate to the outside by effectively transmitting the heat, in general, has a configuration in which a semiconductor device is mounted in a concave portion of a concavity ceramic package inside of which a plurality of wiring layers are provided and a cavity is provided using a sheet-type lid. In another configuration a semiconductor device is mounted on a flat multilayered substrate and a cavity is provided using a lid with a concave portion between this lid and the flat multilayered substrate. In addition, as an example of a higher heat dissipation efficiency, a method in which a surface of a material with a high thermal conductivity contacts with a surface of a semiconductor device is proposed (JP-2856192B).

However, the conventional configuration in which a surface of a material with a high thermal conductivity contacts with a surface of semiconductor device has a problem in that when the semiconductor device is packaged on a wiring board in a face-up manner, an active surface of the semiconductor device contacts with the material with a high thermal conductivity and is covered with the same, which increases an effective dielectric constant at the active surface as compared with the case of contacting with air. This causes a change in the properties of the semiconductor device.

When trying to downsize a semiconductor device operating at a millimeter-wave band, the conventional configurations cannot realize a sufficient heat dissipation capability because heat cannot dissipate effectively, which causes a problem of a deterioration in reliability of a module including the device therein. Therefore, it is difficult to improve the heat dissipation efficiency while downsizing the semiconductor device operating at millimeter-wave band and other circuit components.

SUMMARY OF THE INVENTION

Therefore, in order to cope with the above-stated conventional problems, it is an object of the present invention to provide a semiconductor built-in millimeter-wave band module by which heat generated from a semiconductor device operating at a millimeter-wave band is dissipated effectively so as to improve the heat dissipation effect and at the same time the semiconductor device and other circuit components can be packaged with high density.

In order to fulfill the above-stated object, a semiconductor built-in millimeter-wave band module according to the present invention includes an electrical insulating substrate that is made of a mixture containing an inorganic filler and a thermosetting resin. A high thermal conductivity substrate is made of a dielectric material having thermal conductivity higher than the thermal conductivity of the electrical insulating substrate and is laminated on one surface of the electrical insulating substrate. A plurality of wiring patterns is formed on the high thermal conductivity substrate and the electrical insulating substrate. A semiconductor device operating at millimeter-wave band, which is arranged inside of the electrical insulating substrate, is packaged on the high thermal conductivity substrate in a face-up manner, and is connected electrically with the wiring patterns. A distributed constant circuit element and an active element that are provided on the semiconductor device. In this module, a void is provided inside of the electrical insulating substrate and in the vicinity of a surface of the distributed constant circuit element and a surface of the active element.

DETAILED DESCRIPTION OF THE INVENTION

Figure 1:
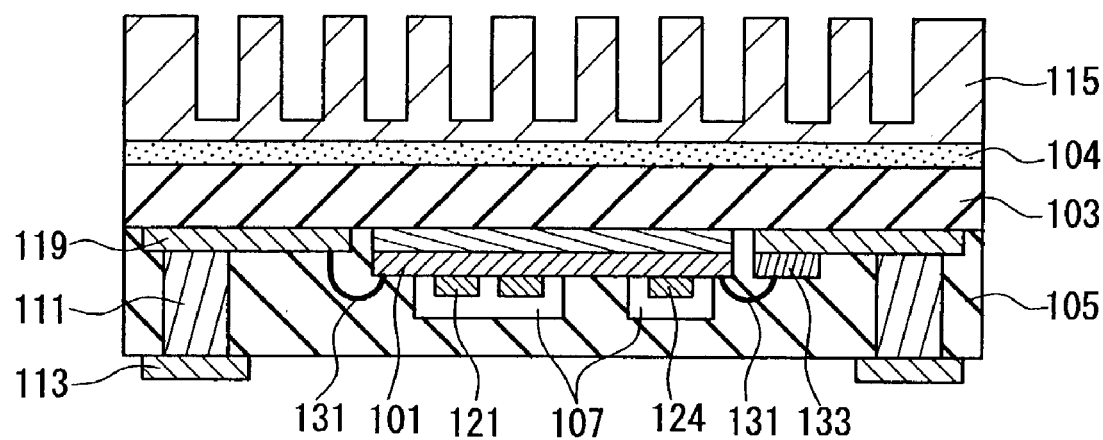
FIG. 1 is a cross-sectional view schematically showing a semiconductor built-in millimeter-wave band module according to Embodiment 1 of the present invention.

A semiconductor built-in millimeter-wave band module according to the present invention includes an electrical insulating substrate that is made of a mixture containing an inorganic filler and a thermosetting resin. A high thermal conductivity substrate is made of a dielectric material having thermal conductivity higher than thermal conductivity of the electrical insulating substrate. A plurality of wiring patterns is formed on the high thermal conductivity substrate and the electrical insulating substrate. A semiconductor device operating at micrometer-wave band or at a millimeter-wave band, which is arranged inside of the electrical insulating substrate, is packaged on the high thermal conductivity substrate in a face-up manner, and is connected electrically with the wiring patterns. A void is provided inside of the electrical insulating substrate and at regions in the vicinity of a distributed constant circuit element formed with a wiring pattern and an active element on the semiconductor device. With this configuration, heat generated from the semiconductor device operating at a millimeter-wave band can be dissipated effectively so as to improve the heat dissipation effects, while the semiconductor device and the other circuit components can be packaged with high density so as to downsize the module.

According to the semiconductor built-in millimeter-wave band module of the present invention, the semiconductor device and a heat sink can be connected in the shortest distance, and electrical wiring and a thermal path for heat dissipation can be provided in different directions. Therefore, as compared with the conventional case where a semiconductor device is die-bonded on a metal base plate, heat can be dissipated effectively, and electrical wiring can be arranged freely. In addition, since the void is formed at a region in the vicinity of a surface on which the distributed constant circuit elements on the semiconductor device are provided, the properties of the semiconductor device at high frequencies equivalent to those in a bare chip state can be obtained without being influenced by the resin composition constituting the electrical insulating substrate for embedding the semiconductor device therein. Furthermore, since the semiconductor device is isolated from outside air, the semiconductor built-in millimeter-wave band module with high reliability can be obtained.

Preferably, the inorganic filler contained in the mixture constituting the electrical insulating substrate includes at least one inorganic filler selected from $Al_2O_3$, BeO, BN, SiC, AlN and $SiO_2$. By using these inorganic fillers, the electrical insulating substrate with excellent heat dissipation capabilities can be obtained. In addition, by selecting an inorganic filler so as to make the coefficient of thermal expansion of the electrical insulating substrate match that of the semiconductor device, the semiconductor built-in millimeter-wave band module with high reliability can be obtained. Here, the resistance of the electrical insulating substrate is $1 \times 10^{10}$ Ω·m or more at a room temperature (25° C.).

Preferably, the high thermal conductivity substrate includes at least one type of ceramic selected from $Al_2O_3$, BeO, BN, AlN and SiC. By using these materials, a high thermal conductivity substrate with excellent heat dissipation capabilities can be obtained. Here, the high thermal conductivity substrate is formed with a dielectric material with a thermal conductivity higher than that of the electrical insulating substrate, and for example they are as follows: $Al_2O_3$ (18 to 33 W/m·K), BeO(260 W/m·K), BN(600 W/m·K), AlN (150 to 210 W/m·K), and SiC (200 to 280 W/m·K).

Preferably, the semiconductor device includes at least one semiconductor selected from a substance comprising Si, GaAs, SiGe, InP and SiC. By using these semiconductor devices, the semiconductor built-in millimeter-wave band module with excellent frequency characteristics at high frequencies can be obtained.

The semiconductor device preferably is isolated from outside air by the electrical insulating substrate. By isolating the semiconductor device from outside air, the deterioration of the reliability of the semiconductor device due to humidity can be avoided.

In the module according to the present invention, a second high thermal conductivity substrate may be laminated on the other surface of the electrical insulating substrate. With this configuration, an influence on the warp occurring over the whole module with a temperature change during operation can be prevented by virtue of the provision of the same materials on both sides of the electrical insulating substrate. Moreover, even when the high thermal conductivity substrate is made thinner or when a film form resin material is used, an influence on the warp can be prevented and the overall height and thickness of the module can be made smaller. As a result, the physical distance between the semiconductor and the heat sink can be made shorter, and therefore when a thermal via hole for heat dissipation is provided in the high thermal conductivity substrate immediately under the semiconductor device, heat from the semiconductor device can be dissipated further effectively.

In the above module, the void may extend to the second high thermal conductivity substrate. With this configuration, in the process of manufacturing the semiconductor built-in millimeter-wave band module, when the sheet member in the manufacturing method of Embodiment 1, which will be described later, is manufactured in which the first through hole for forming the void is formed and the second through hole is filled with the conductive resin composition, such a sheet member can be manufactured by forming the second through hole in one mixture, filling the second through hole with the conductive resin composition, and then forming the first through hole for forming the void, so that the semiconductor built-in millimeter-wave band module can be manufactured more effectively.

In addition, the above module further may include: on the other surface of the electrical insulating substrate, a low dielectric loss substrate made of a material with dielectric loss lower than that of the electrical insulating substrate; a plurality of wiring patterns formed on the low dielectric loss substrate; a filter element arranged inside of the electrical insulating substrate and provided on the low dielectric loss substrate; and a void provided at a region in the vicinity of a surface of the filter element. With this configuration, while heat can be dissipated with high efficiency, electrical wiring can be arranged freely. Besides, the high frequency characteristics of the semiconductor device equivalent to those in a bare chip state can be obtained. In addition, although the filter element is included therein, since the void is formed at a region in the vicinity of the filter element, the filter element is free from the influence by the resin composition constituting the electrical insulating substrate for embedding the filter element therein. Therefore, a filter element with low loss can be included therein, so that the semiconductor device can be connected therewith in the shortest distance, which can reduce a loss due to the connection.

Preferably, the low dielectric loss substrate includes at least one type of ceramic selected from $Al_2O_3$, BeO, BN, SiC, AlN and SiC. In addition, the low dielectric loss substrate has a heat distortion temperature not less than 180° C. and preferably not less than 200° C. The heat distortion temperature is set at 180° C. or more because a temperature up to 175° C. is applied thereto in the lamination process for manufacturing the module of the present invention. The heat resistant resin that can used in the present invention, for example, includes at least one type of resin selected from a fluorine resin, a polyimide (PI) resin, an aramid resin including a meta group and a para group, a polyester resin, a polyamide-imide resin, a polyester-imide resin, a polyether ketone (PEK) resin, a polyether ether ketone (PEEK) resin, a polysulfone (PS) resin, a bismaleimide-triazine resin, a polyphenylene ether (PPE) resin, a polyphenylene sulfide (PPS) resin, a polybenzimidazole resin, a liquid crystal polymer and polybenzo-cyclobutene. The fluorine resin, for example, includes polytetrafluoroethylene (PTFE), tetrafluoroethylene-perfluoro alkyl vinyl ether copolymer (PFA), polychloro-trifluoroethylene (PCTFE), polyvinylidene fluoride (PVDF), polyvinyl fluoride (PVF), tetrafluoroethylene-hexafluoropropylene copolymer (FEP) and tetrafluoroethylene-ethylene copolymer (PETFE). These materials can reduce the insertion loss of the filter element that is manufactured on the low dielectric loss substrate, so that a filter with high performance can be obtained.

For instance, the electrical insulating substrate formed by mixing 90 weight % of aluminum oxide powder with an average particle diameter of 12 μm, 8 weight % of bisphenol A epoxy resin, and 2 weight % of hardening agent has a dielectric constant of about 0.02, whereas the above-described low dielectric loss substrate has a dielectric constant of about 0.002.

In the semiconductor built-in millimeter-wave band module of the present invention, the distributed constant circuit element and the active element provided on the semiconductor device and the filter element provided on the low dielectric loss substrate may be provided in the same void. With this configuration, the semiconductor built-in millimeter-wave band module including the semiconductor device and the filter element therein can be manufactured effectively.

In the above module, a shield conductor may be provided on a side of the void, the surface being opposed to the distributed constant circuit element. With this configuration, the shield conductor can prevent the leakage of a signal between the semiconductor device and the filter element. In addition to that, the deformation of the shape of the void due to the softening of the resin, which might occur in a void formation step during the manufacturing process of the semiconductor built-in millimeter-wave band module, can be reduced.

In the above module, the shield electrode may be shared with a plurality of voids. With this configuration, the number of layers in the electrical insulating substrate can be reduced, and the module can be manufactured effectively.

The above module further may include a circuit component that is arranged inside of the electrical insulating substrate and is connected electrically with the wiring patterns. With this configuration, even when the circuit component is included therein, the connecting distance between the semiconductor device and the circuit component can be made shorter. Thereby, a noise in the electric signal can be reduced, so that a semiconductor built-in millimeter-wave band module with excellent high frequency characteristics can be obtained. In addition, since the circuit component whose properties are guaranteed beforehand is included therein, a module with a high yield during the manufacturing process and with a high reliability can be realized.

Note here that the circuit component preferably is isolated from outside air by the electrical insulating substrate. By isolating the circuit component from outside air, the deterioration of the reliability of the circuit component due to humidity can be avoided.

Another semiconductor built-in millimeter-wave band module according to the present invention includes: first and second electrical insulating substrates made of a mixture containing an inorganic filler and a thermosetting resin. A high thermal conductivity substrate is made of a dielectric material having thermal conductivity higher than thermal conductivity of the first electrical insulating substrate and that is laminated on one surface of the first electrical insulating substrate. A first and a second low dielectric loss substrate are made of a material with dielectric loss lower than the dielectric loss of the first electrical insulating substrate. A plurality of wiring patterns is formed on the high thermal conductivity substrate, the first and the second electrical insulating substrates and the first and the second low dielectric loss substrates. A semiconductor device operating at millimeter-wave band, which is arranged inside of the first electrical insulating substrate, is packaged on the high thermal conductivity substrate in a face-up manner, and is connected electrically with the wiring patterns. A distributed constant circuit element and an active element are provided on the semiconductor device. A void is provided inside of the first electrical insulating substrate and at regions in the vicinity of the distributed constant circuit element and the active element on the semiconductor device. A circuit component is arranged inside of the second electrical insulating substrate and is connected electrically with the wiring pattern on the second low dielectric loss substrate. In this module, the first low dielectric loss substrate is laminated on the other side of the first electrical insulating substrate, and the second electrical insulating substrate is laminated between the first low dielectric loss substrate and the second low dielectric loss substrate.

According to this semiconductor built-in millimeter-wave band module, heat from the semiconductor device can be dissipated effectively, properties equivalent to those in a bare chip state can be obtained, the semiconductor device can be connected to the filter with low loss using the short wiring, excellent high frequency characteristics are realized and a high yield during the manufacturing process and high reliability can be realized. In addition to them, the length of the wiring between the circuit components mounted on the plurality of low dielectric loss substrates and the semiconductor device or the filter element can be made significantly shorter as compared with the case where the low dielectric loss substrates are not laminated into a multilayered structure but arranged two-dimensionally. Therefore, a loss in the signal due to the wiring can be reduced, and a mounting area of the module with the same function can be reduced and miniaturized so that circuit components can be packaged densely.

Still another semiconductor built-in millimeter-wave band module according to the present invention includes: an electrical insulating substrate that is made of a mixture containing an inorganic filler and a thermosetting resin. A high thermal conductivity substrate is made of a dielectric material having thermal conductivity higher than thermal conductivity of the electrical insulating substrate and is laminated on one surface of the electrical insulating substrate. A low dielectric loss substrate is made of a material with dielectric loss lower than the dielectric loss of the electrical insulating substrate and is laminated on the other surface of the electrical insulating substrate. A plurality of wiring patterns is formed on the high thermal conductivity substrate, the electrical insulating substrate and the low dielectric loss substrate. A high frequency signal output terminal and an external signal input terminal are provided on the high thermal conductivity substrate or the low dielectric loss substrate. A semiconductor device operating at a millimeter-wave band, which is arranged inside of the electrical insulating substrate, is packaged on the high thermal conductivity substrate in a face-up manner, and is connected electrically with the wiring patterns. A distributed constant circuit element and an active element that are provided on the semiconductor device. A filter element is arranged inside of the electrical insulating substrate and is provided on the low dielectric loss substrate. A void is provided inside of the electrical insulating substrate and at regions in the vicinity of the distributed constant circuit element and the active element on the semiconductor device and the filter element. In the module, the external signal input terminal and an input terminal of the filter element is connected electrically with each other, an output terminal of the filter element and an input terminal of the semiconductor device are connected electrically with each other, an output terminal of the semiconductor device and the high frequency signal output terminal are connected electrically with each other.

According to this semiconductor built-in millimeter-wave band module, in the case of the semiconductor device being a power amplifier for high output, a transmission module can be obtained so that the semiconductor built-in millimeter-wave band module realizes one integral transmission function, whereby the number of components constituting a communication instrument handling millimeter-wave band signals can be reduced. In the case of the semiconductor device being a low-noise amplifier, a receiving module can be obtained. In addition, according to the semiconductor built-in millimeter-wave band module using a plurality of semiconductor devices, a millimeter-wave band front end module with an integrated transmission/reception function can be obtained.

As described above, according to the semiconductor built-in millimeter-wave band module of the present invention, the semiconductor device and a heat sink can be connected in the shortest distance, and electrical wiring and a thermal path for heat dissipation can be provided in different directions. Therefore, heat can be dissipated effectively, and electrical wiring can be arranged freely. In addition, since the void is formed at a region in the vicinity of a surface on which the distributed constant circuit elements on the semiconductor device are provided, the properties of the semiconductor device at high frequencies equivalent to those in a bare chip state can be obtained without being influenced by the resin composition constituting the electrical insulating substrate for embedding the semiconductor device therein.

In addition, according to the semiconductor built-in millimeter-wave band module of the present invention, since the filter element and the circuit component are included therein, the connecting distance between the semiconductor device and these circuit components can be made shorter. Thereby, a semiconductor built-in millimeter-wave band module with excellent high-frequency characteristics such as a reduced noise in the electric signal can be obtained. In addition, since the circuit component whose properties are guaranteed beforehand is included therein, a module with a high yield during the manufacturing process and with a high reliability can be realized.

Furthermore, according to the semiconductor built-in millimeter-wave band module of the present invention, the multilayered structure allows the semiconductor device and the circuit component to be connected in the short distance, so that a loss in the signal due to the wiring can be reduced, and a mounting area of the module with the same function can be reduced and miniaturized so that circuit components can be packaged densely.

EMBODIMENTS

The following describes specific embodiments of a semiconductor built-in millimeter-wave band module according to the present invention, with reference to the drawings. Since elements assigned to the same reference numeral are identical with one another in the following embodiments, their explanation may be omitted.

Embodiment 1

FIG. 1 is a cross-sectional view schematically showing a configuration of a semiconductor built-in millimeter-wave band module according to Embodiment 1 of the present invention.

The semiconductor built-in millimeter-wave band module according to this embodiment will be described below, with reference to FIG. 1. In FIG. 1, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

The semiconductor device 101 operates at a millimeter-wave band, and the millimeter-wave band generally refers to 30 GHz or higher, for example, 32 GHz, 60 GHz and 72 GHz, and includes 26 GHz as a special one.

On the semiconductor device 101, an active element 124 and a passive circuit element 121 (hereinafter referred to as "distributed constant circuit element") formed with a pattern are formed, where the passive circuit includes a matching circuit using a wiring for connecting these active elements and a stub, a coupled line, a filter and a stub for bypass. The stub is a wiring provided with a branch portion for adjusting impedance of the wiring, and the end portion of the stub is connected electrically to an open end or to the grounding layer using a via hole and the like. For instance, by adjusting a wiring length from the branch portion at a length of ¼ of the wavelength of a propagated signal and by making the wiring end open or short-circuited, the branch portion becomes a state of short-circuited or open, respectively. This stub particularly is connected with an input terminal and an output terminal of a transistor and is used for adjusting input/output impedance. The active element 124 may be one or more of, for example, a bipolar transistor, a field effect transistor (FET) and a diode.

A void 107 is formed in regions of an insulating substrate 105 made of a mixture containing an inorganic filler and a thermosetting resin in the vicinity of the distributed constant circuit element 121 and the active element 124 provided on the semiconductor device 101.

This void 107 is provided for preventing the distributed constant circuit element 121 and the active element 124 on the semiconductor device 101 from contacting with the insulating substrate 105, and a size and a shape of the void is not limited especially. Preferably, the minimum space between the walls of the void 107 and the respective elements is a space of approximately 100 μm or more. Since a distributed constant circuit element and an active element normally are designed and manufactured assuming that these elements contact with air (dielectric constant of 1), the provision of such a void is required. Preferably, the shapes of these voids are uniform. Furthermore, in order to manufacture a compact module, it is preferable that these voids have the required minimum gap and a uniform space.

Figure 14:
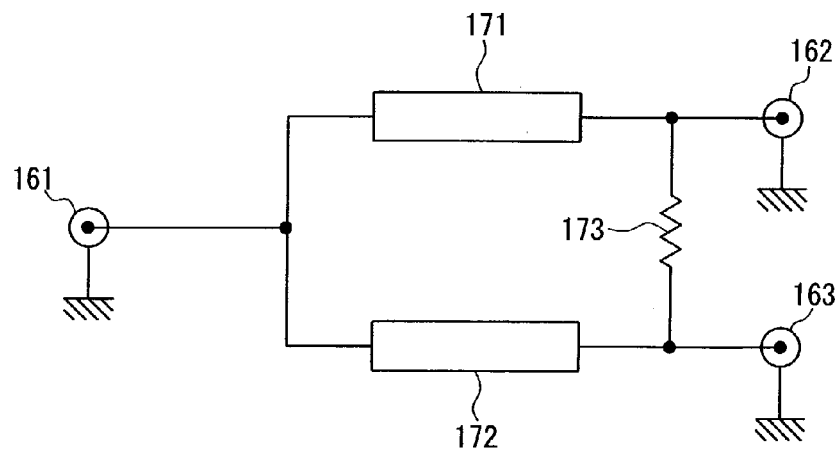
FIG. 14 shows a distributed constant line for synthesizing an output power of the semiconductor built-in millimeter-wave band module according to Embodiment 1 of the present invention.

Since the void is provided at a portion where a wiring and an active element provided on a semiconductor element are arranged, the shape of the void may be changed freely depending on the arrangement. For instance, in the case of a GaAs, 26 GHz band high power amplifying semiconductor device (power consumption: 5W, output at 1 dB gain compression point: 30 dBm), monolithic microwave integrated circuits (MMIC) are formed in which a plurality of amplifiers are included in one chip and a distributed constant line for combining output power from the respective amplifiers also is formed in the same chip (See FIG. 14). FIG. 14 schematically shows a circuit diagram of an example of a Wilkinson divider/combiner using a distributed constant line. A signal with a wavelength of λ is input from an input port 161, and divided signals are output from a first output port 162 and a second output port 163. In the case of a system where a load of 50Ω is connected with each of the first output port and the second output port, a first distributed constant line 171 and a second distributed constant line 172 respectively are provided between the input ports and the first and the second output ports, where each of the first and second distributed constant lines 171 and 172 has a characteristic impedance of 70.7Ω and a length of ¼ of a wavelength of the input signal. Also, between the first output port and the second output port, a resistor 173 of 100Ω is connected. With this configuration, a half power with a same phase as the input signal is output from each of the first and the second output port. When these first distributed constant line and second distributed constant line are provided on a semiconductor device, these lines normally have a microstrip line structure. In this case, a line through which a signal is propagated is manufactured to have a desired impedance value in a state where the line contacts with an air layer. If a resin layer is formed at a region contacting with the microstrip line, an effective dielectric constant changes as compared with a case where an air layer is provided, and therefore the characteristic impedance would deviate from the desired value. In addition, since an electromagnetic wave has a property of its wavelength varying with the dielectric constant of a medium in which the electromagnetic wave exists, a wavelength is decreased in the case of a resin layer provided on a surface of the microstrip line when compared with the case of an air layer provided thereon. As a result, the first distributed constant line and the second distributed constant line no longer have the length equivalent to ¼ of the wavelength. Thereby, a portion of the input signal is output to the input port and the remaining portion is output to the output port, so that the signal cannot be distributed effectively. To avoid this, a void is provided at regions in which an active element and a distributed constant line provided in a semiconductor device are formed.

Figure 15:
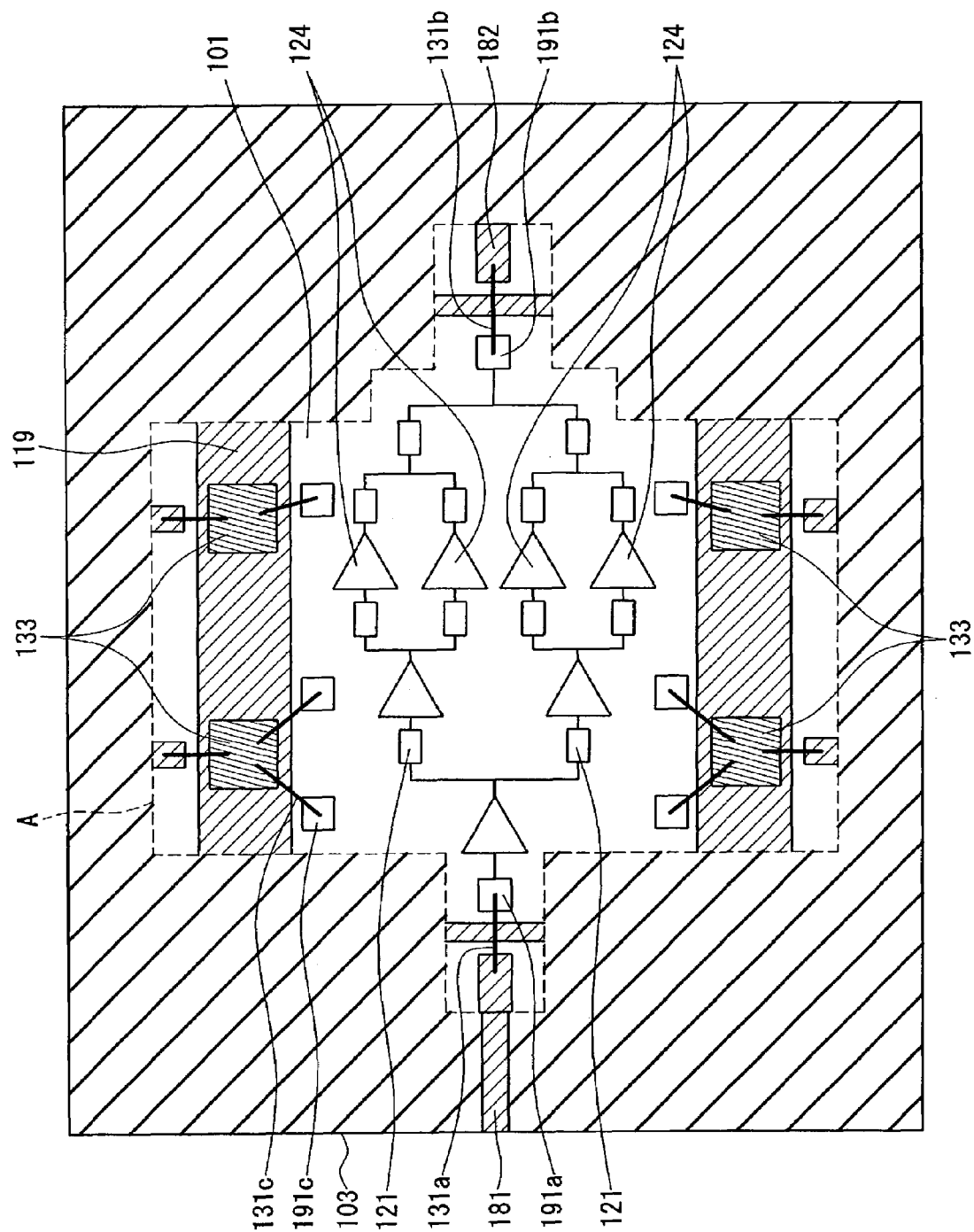
FIG. 15 is a plan view showing a main portion of the semiconductor built-in millimeter-wave band module according to Embodiment 1 of the present invention.

FIG. 15 is a top plan view that schematically shows a relationship among a semiconductor device and an active element and a distributed constant circuit element that are provided on the semiconductor device. The semiconductor device 101 is packaged on the high thermal conductivity substrate 103 in a face-up manner. An input side wiring pattern 181 and an output side wiring pattern 182 provided on the high thermal conductivity substrate 103 are wire-bonded to pads 191*a* and 191*b* on the semiconductor device 101 via wires 131*a* and 131*b*. Also, the bypass capacitor 133 mounted on a wiring pattern 119 and the pad 191*c* are connected with each other via the wire 131*c*. On the semiconductor device 101, a plurality of active elements 124 and a plurality of distributed constant circuit elements 121 are provided. The active elements 124, for example, are FETs, which are connected electrically via the distributed constant circuit elements 121 to distribute and synthesize effectively power of a signal amplified by the FETs. Inside of a portion surrounded with the dotted line A, a void is provided. The active elements 124 and the distributed constant circuit elements 121 each connecting between the active elements 124 should be formed in the void.

Additionally, when the minimum width of the dimensions of the void is made smaller than the dimensions of the semiconductor by providing an insulating substrate so as to contact with a partial region on the semiconductor device, the void can be formed with stability. As a result, effective dielectric constants of the active elements and the distributed constant circuit lines provided on the semiconductor device can be stabilized. In this case, a portion of the semiconductor device assumes a state of being embedded in the insulating substrate. If the dimensions of the void are changed, the electromagnetic field distribution of the active elements and the distributed constant lines are changed, so that their effective dielectric constants are changed. Therefore, if wiring formed in the void is a distributed constant line, its characteristic impedance changes, thus causing a change in the signal characteristics.

Note here that at a region on the semiconductor device where the distributed constant circuits 121 and the active elements 124 are not present, as shown in FIG. 1, the insulating substrate 105 may contact with a surface of the semiconductor device 101.

Figure 17:
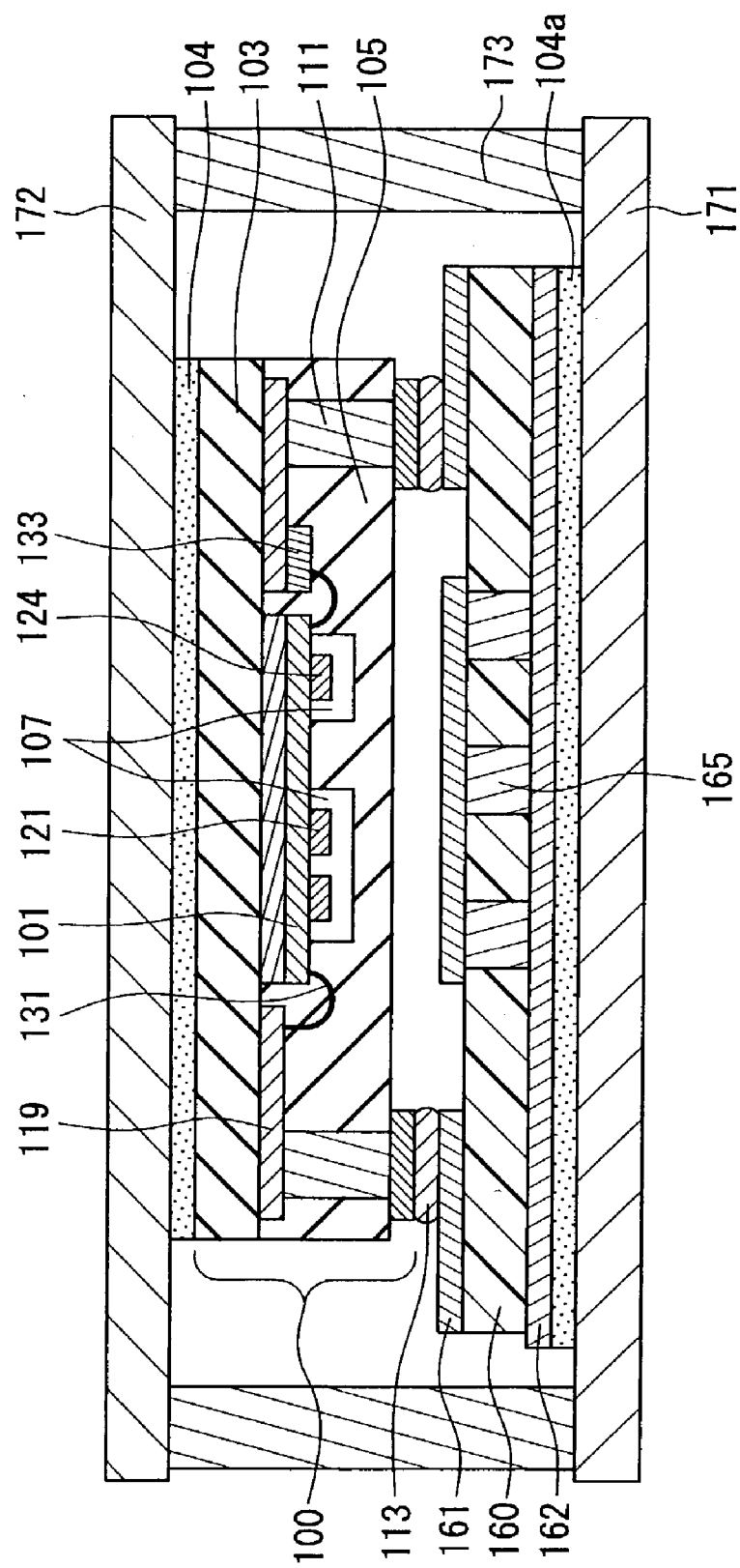
FIG. 17 is a cross-sectional view schematically showing a semiconductor built-in millimeter-wave band module according to Embodiment 11 of the present invention.

The wiring pattern 119 formed on the high thermal conductivity substrate 103 is connected electrically with an external electrode 113 provided on the insulating substrate 105 via a via conductor 111. On a surface of the high thermal conductivity substrate 103 opposite the surface with the semiconductor device 101 formed thereon, a heat sink 115 is mounted integrally using an adhesion layer 104 to dissipate heat. As the heat sink, die-casting aluminum or the like is used, and a fin or the like is provided so as to increase the surface area to facilitate the heat dissipation. The shape of the fin may be adopted freely depending on a heating value from heat generating elements, an ambient temperature during the operation, and a thermal resistance from the heat generating element to a heat sink connecting portion. For instance, as the shape of the fin, a thickness of 0.5 to 2 mm and a height of 2 to 90 mm are used optionally. The bonding between the high thermal conductivity substrate and the heat sink may be conducted by applying a high thermal conductivity silicone oil compound "G765" (trade name) made by Shin-Etsu Chemical Co., Ltd. according to a method such as printing at a region to be bonded to the heat sink on the high thermal conductivity substrate, to have a thickness not more than 200 µm, and thereafter by overlaying the heat sink thereon, followed by the application of, for example, pressure at $1\times10^5$ Pa. Thereby, the heat sink can be bonded to the high thermal conductivity substrate. The heat sink may be replaced with a casing made of a metal such as aluminum capable of dissipating heat from the semiconductor built-in millimeter-wave band module (FIG. 17). This heat sink 115 may be attached thereto if required. This applies to the following embodiments also.

In FIG. 1, the insulating substrate 105 is made of a mixture containing an inorganic filler and a thermosetting resin. As the inorganic filler, for example, at least one selected from $Al_2O_3$, BeO, BN, SiC, AlN and $SiO_2$ can be used. It is preferable that the inorganic filler is contained in a range of 70 weight % to 95 weight %, inclusive, with reference to the mixture. It is preferable that an average particle diameter of the inorganic filler is in a range of 0.1 µm to 100 µm, inclusive. The thermosetting resin, for example, can be selected from an epoxy resin, a phenol resin and a cyanate resin with high heat resistance. The epoxy resin is particularly preferable because of especially high heat resistance. The mixture further may contain a dispersing agent, a coloring agent, a coupling agent or a releasing agent.

To be more specific, an insulating substrate with a thickness of 200 µm was manufactured, in which 90 weight % of aluminum powder with an average particle diameter of 12 µm, 8 weight % of bisphenol A epoxy resin, and 2 weight % of hardening agent were mixed.

The wiring pattern 119 is made of a material exhibiting electrical conductivity, and for example is formed with copper foil or a conductive resin composition. When a thin film conductor is used as the wiring pattern, a conductor made of Ni/Cr and Au is formed on the high thermal conductivity substrate 103 by sputtering and the like.

As the wiring pattern 119 on the high thermal conductivity substrate 103 for transmitting a high-frequency signal, a transmission line for high frequency such as a microstrip line and a coplanar line is used.

The semiconductor device 101 is die-bonded to the high thermal conductivity substrate 103 using a resin composition containing a metal filler or an inorganic filler and a thermosetting resin, a solder and the like. As the solder, for example, lead/tin base eutectic solder, high temperature solder and gold/tin solder can be used. As the resin composition, for example, an epoxy resin, a phenol resin and a cyanate resin with high heat resistance can be selected. As the filler, for example, silver, silver-palladium, copper, $Al_2O_3$, BeO, BN, SiC, AlN and $SiO_2$ can be used. The gold/tin solder and the like are particularly preferable because the thermal resistance between the semiconductor device 101 and the high thermal conductivity substrate 103 can be made small. To be more specific, a GaAs semiconductor device was die-bonded to an AlN substrate with a thickness of 500 µm using ribbon-like AnSn solder (Au: 80 weight %) with a thickness of 30 µm.

The semiconductor built-in millimeter-wave band module shown in FIG. 1 has the voids 107 formed at regions in the vicinity of the active elements and the passive circuit elements 121 formed with a pattern, which are provided on the semiconductor device 101. Therefore the high-frequency characteristics of the semiconductor element 101 even in the case of packaged as the semiconductor built-in millimeter-wave band module do not change as compared with the properties of the semiconductor device 101 as a unit.

At the same time, the rear face of the semiconductor device 101 is bonded to the high thermal conductivity substrate 103 using a material with low thermal resistance, and therefore heat can be dissipated effectively so as to improve the heat dissipation effect.

In addition, according to the semiconductor built-in millimeter-wave band module, by selecting an inorganic filler used for the insulating substrate 105, a coefficient of linear expansion, heat conductivity, dielectric constant and the like of the insulating substrate 105 can be controlled easily. By making the coefficient of linear expansion of the insulating substrate 105 approximately the same as that of the high thermal conductivity substrate 103, the generation of a crack caused by a thermal change and the like can be prevented, so that a semiconductor built-in millimeter-wave band module with high reliability can be obtained.

Furthermore, according to the semiconductor built-in millimeter-wave band module, the insulating substrate 105 can isolate the semiconductor device 101 from outside air, thus preventing a deterioration of reliability due to humidity. Moreover, since the semiconductor built-in millimeter-wave band module according to this embodiment uses the mixture of the inorganic filler and the thermosetting resin as the material of the insulating substrate 105, there is no need to bake the substrate at high temperatures unlike a ceramic substrate.

The following describes one example of a method for manufacturing the semiconductor built-in millimeter-wave band module according to the present invention, with reference to FIGS. 2A to 2G. FIGS. 2A to 2G are cross-sectional views showing one embodiment of the process of manufacturing a semiconductor built-in millimeter-wave band module.

Figure 2A:
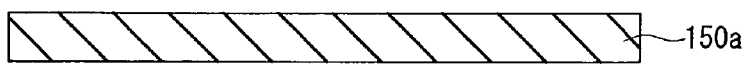
FIGS. 2A to 2G are cross-sectional views schematically showing a method of manufacturing the semiconductor built-in millimeter-wave band module according to Embodiment 1 of the present invention.

Firstly, as shown in FIG. 2A, a mixture containing an inorganic filler and a thermosetting resin is processed to form a mixture sheet 150a in a sheet form. Such a mixture sheet 150a in a sheet form can be formed by mixing the inorganic filler and an uncured thermosetting resin into a mixture paste and by shaping the mixture paste to have a uniform thickness. The mixture sheet 150a in a sheet form may undergo heat treatment at a curing temperature of the thermosetting resin. For example, when a thermosetting epoxy resin is used, a heat treatment condition is kept at a temperature of 120° C. for 15 minutes. This thermosetting epoxy resin has a curing starting temperature at 130° C., and therefore the resin is in a semi-cured state or a partially cured state (B stage) under the above-stated heat treatment condition, and can be melted again by the application of heat in the later steps. By conducting the heat treatment as described above, the adhesiveness of the mixture sheet 150a can be removed while keeping the flexibility of the same, thus facilitating a procedure in the later steps. In addition, for a mixture including a thermosetting resin dissolved in a solvent, a heat treatment serves to remove the solvent partially.

Figure 2B:
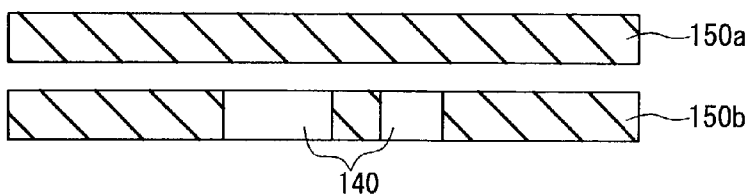

Thereafter, as shown in FIG. 2B, a first through hole 140 is formed at a desired position of a mixture sheet 150b. This first through hole 140 can be formed by, for example, laser processing, processing using a drill or a mold. The laser processing is preferable because this method can form the first through hole 140 with a fine pitch and does not generate swarf. As for the laser processing, $CO_2$ laser and excimer laser facilitate the processing.

Preferably, the first through hole 140 is formed at a region, when overlaying and laminating on the high thermal conductivity substrate, on which a semiconductor device is provided, which will be described later, so that the first through hole contacts with active elements and distributed constant circuit elements formed with a wiring pattern that are formed on the semiconductor device.

Next, the mixture sheet 150b in which the first through hole 140 is formed and the mixture sheet 150a in which no through hole is formed are aligned with each other to be overlaid, and are integrated by the application of pressure at, for example, $9.8 \times 10^5$ Pa.

Figure 2C:
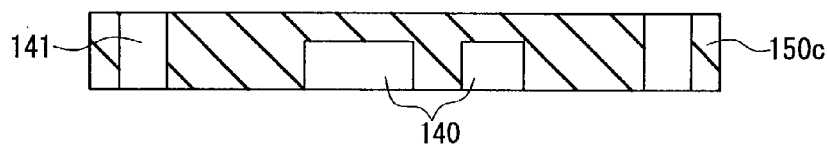

After that, as shown in FIG. 2C, a second through hole 141 is formed at a desired position in the thus integrated mixture sheet 150c. This second through hole 141 is formed in the same manner as in the first through hole 140. Note here that the second through hole 141 may be formed simultaneously with the formation of the mixture sheet 150c in a sheet form by shaping the mixture paste.

Figure 2D:
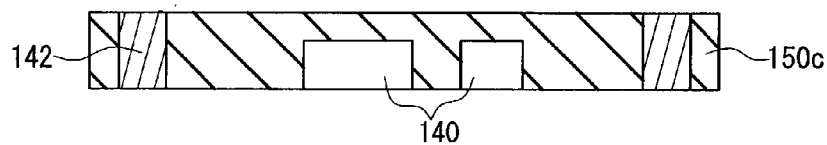

After that, as shown in FIG. 2D, the second through hole 141 is filled with a conductive resin composition 142 to form a sheet member with the second through hole 141 filled with the conductive resin composition 142.

Figure 2E:
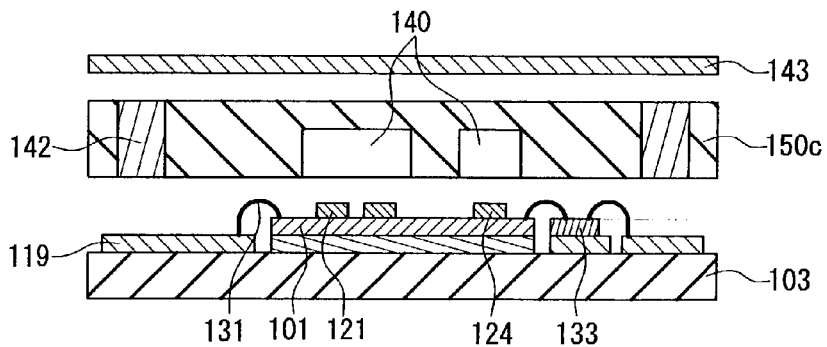

In parallel with the process of FIGS. 2A to 2D, a high thermal conductivity substrate 103 is prepared as shown in FIG. 2E. As its material, for example, $Al_2O_3$, BeO, BN, SiC, AlN and $SiO_2$ are available. AlN, SiC and the like are preferable because of exerting high heat dissipation effects. The semiconductor device 101 made of GaAs, InP and the like is die-bonded to this high thermal conductivity substrate 103, followed by the wire bonding to the wiring pattern 119 via the wire 131.

The semiconductor device 101 is for example a GaAs semiconductor device with dimensions of 4 mm×2.5 mm and a thickness of 50 μm, having a power consumption of 5 W, and such a semiconductor device is die-bonded to an AlN substrate with a thickness of 500 μm using a ribbon-like AnSn solder (Au: 80 weight %) with a thickness of 30 μm. When conducting the die-bonding, the semiconductor device is aligned using a jig made of carbon in an atmosphere of nitrogen under the condition of 320° C. kept for 10 seconds. When the semiconductor is die-bonded using alloy base solder, the stress occurs at the bonding portion due to a difference in coefficient of thermal expansion. To avoid this, a material in view of the coefficients of thermal expansion of the semiconductor device and the die-bonding substrate can be selected. Thereafter, a conductive epoxy adhesive "H20E" (trade name) made by Epoxy Technology Inc., is supplied onto the AlN substrate by a dispensing method. Then, a bypass capacitor measuring 0.5 mm per side is mounted thereon and cured at a temperature of 150° C. for 15 minutes, so as to package the bypass capacitor 133 on the AlN substrate. After that, the semiconductor device, the wiring 119 on the AlN substrate and the bypass capacitor 133 are wire-bonded using an Au wire with a diameter of 25 μm on a heater stage at a temperature of 150° C. The die-bonding can be conducted using a resin composition in which a metal such as silver is dispersed, and in order to enhance the heat dissipation effects, gold/tin solder, lead/tin solder and the like also can be used. Similarly, the distributed constant circuit element 121 and the active element 124 also are packaged onto the AlN substrate by die-bonding.

After that, the high thermal conductivity substrate 103 on which the semiconductor device 101 is packaged, the mixture sheet in a sheet form 150c shown in FIG. 2D, and copper foil 143 are aligned and overlaid with one another.

Figure 2F:
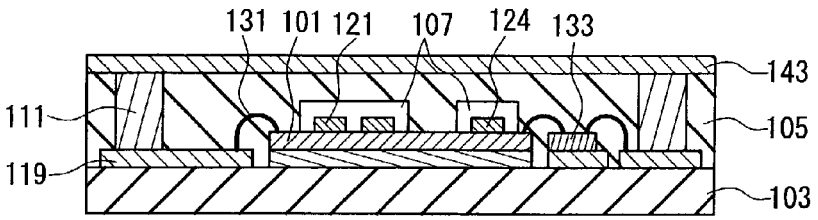

Next, as shown in FIG. 2F, heat and pressure are applied thereto, for example, using hot pressing at a pressing temperature of 120° C. and pressure of $9.8 \times 10^5$ Pa for 5 minutes. As a result, the thermosetting resin contained in the mixture sheet 150c is melted and softened by the heat, so that a sheet member 105 in which the semiconductor device 101 is embedded can be formed and the conductive resin composition 142 is compressed so as to form a via conductor 111. Subsequently, by applying heat thereto, the thermosetting resins contained in the mixture sheet 150c and the via conductor 111 are cured. As a result, the semiconductor device is embedded and a void 107 is formed at each of the regions in the vicinity of the active element 124 and the distributed constant circuit element 121 formed with the wiring pattern on the semiconductor device.

The above-stated heating temperature may be a temperature not lower than a curing temperature of the thermosetting resins contained in the mixture sheet 150c and the conductive resin composition 142 (e.g., 150° C. to 260° C.). By following this process, the copper foil 143, the high thermal conductivity substrate 103 and the insulating substrate 105 are bonded mechanically and firmly. In addition, the copper foil 143 is connected electrically by means of the via conductor 111. Note here that when curing the thermosetting resins contained in the mixture sheet 150c and the conductive resin composition 142 by the heat, by applying pressure at $9.8 \times 10^5$ Pa, which is the best condition, to $1.96 \times 10^7$ Pa as well as the heat, the mechanical strength of the semiconductor built-in millimeter-wave module further can be improved. The heating condition is at 175° C. for 60 minutes. Thereby, the epoxy resin contained in the mixture sheet 150c and the epoxy resin contained in the conductive resin composition are cured. This applies to the following embodiments also.

Figure 2G:
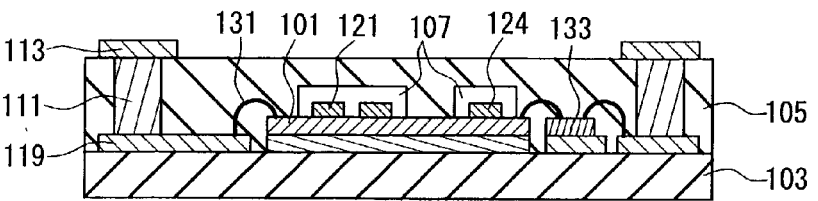

After that, as shown in FIG. 2G, the copper foil 143 undergoes an etching-process so as to form an external electrode 113. In this way, the semiconductor built-in millimeter-wave band module is formed. Although the through hole 141 is filled with the conductive resin composition 142 as the conductive material in this embodiment, such a conductive material is not limited especially insofar as being a thermosetting conductive material.

According to the thus configured semiconductor built-in millimeter-wave band module, the semiconductor device and the heat sink can be connected in the shortest distance, and electrical wiring and a thermal path for heat dissipation can be provided in different directions. Therefore, as compared with the conventional case where a semiconductor device is die-bonded on a metal base plate, heat can be dissipated effectively, and electrical wiring can be arranged freely. In addition, since the void is formed at a region in the vicinity of a surface on which the distributed constant circuit elements on the semiconductor device are provided, the properties of the semiconductor device at high frequencies equivalent to those in a bare chip state can be obtained without being influenced by the resin composition constituting the insulating substrate for embedding the semiconductor device therein. Furthermore, since the semiconductor device is isolated from outside air, the semiconductor built-in millimeter-wave band module with high reliability can be obtained.

Embodiment 2

Figure 3:
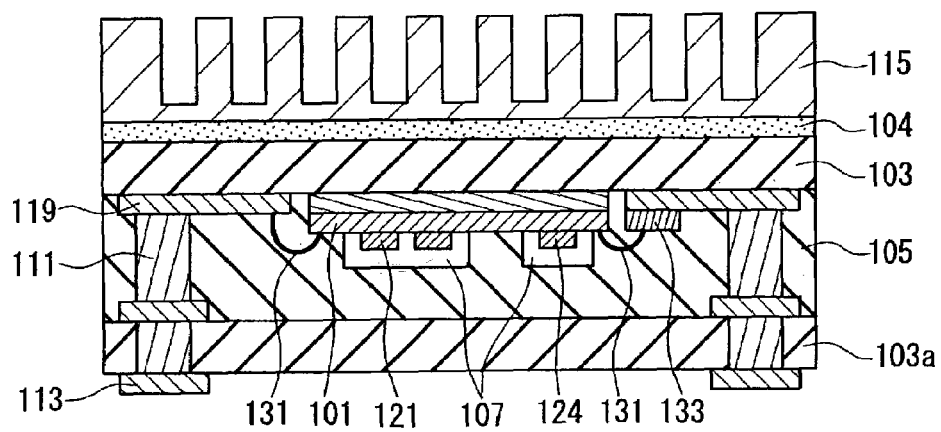
FIG. 3 is a cross-sectional view schematically showing a semiconductor built-in millimeter-wave band module according to Embodiment 2 of the present invention.

FIG. 3 is a cross-sectional view schematically showing a configuration of a semiconductor built-in millimeter-wave band module according to Embodiment 2 of the present invention.

The following describes the semiconductor built-in millimeter-wave band module of this embodiment, with reference to FIG. 3. In FIG. 3, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

A void 107 is formed at regions of an insulating substrate 105 made of a mixture containing an inorganic filler and a thermosetting resin in the vicinity of a distributed constant circuit element 121 and an active element 124 formed on the semiconductor device 101. On both sides of the insulating substrate 105, the high thermal conductivity substrates 103 and 103a are provided, where a wiring pattern 119 provided on the high thermal conductivity substrate 103 is connected electrically with an external electrode 113 through a via conductor 111 provided in the insulating substrate 105 and a via conductor provided in the lower high thermal conductivity substrate 103a. On an outer surface of the high thermal conductivity substrate 103, a heat sink 115 is mounted to dissipate heat via a thermal conductive adhesive 104.

As the high thermal conductivity substrate, a film form resin material selected from PTFE, bismaleimide-triazine, PPO, PPE, liquid crystal polymer, polybenzocyclobutene, polyimide and the like also can be used, in addition to the materials described in Embodiment 1.

As the high thermal conductivity substrate made of a ceramic material, a thickness of the substrate may be selected normally at 100 μm or more in terms of the handling ease of the substrate during a manufacturing process of the semiconductor built-in millimeter-wave band module. However, in the case of using the film form resin material, a thickness can be made at 100 μm or less, and therefore for the purpose of miniaturization, a film form resin material is used preferably.

In addition to the effects described in Embodiment 1, the thus configured semiconductor built-in millimeter-wave band module can prevent an influence on the warp occurring over the whole module with a temperature change during operation by virtue of the provision of the same materials on both sides of the insulating substrate. Moreover, even when the high thermal conductivity substrate is made thinner or when a film form resin material is used, an influence on the warp can be prevented. Additionally, the overall height and thickness of the module can be made smaller. As a result, the physical distance between the semiconductor and the heat sink can be made shorter, and therefore when a thermal via hole for heat dissipation is provided in the high thermal conductivity substrate immediately under the semiconductor device, heat from the semiconductor device can be dissipated further effectively. Here, the thermal via hole is obtained by filling a through hole with a filler for heat dissipation, and a normal via hole for electrical connection can double as the thermal via hole depending on the use.

Embodiment 3

Figure 4:
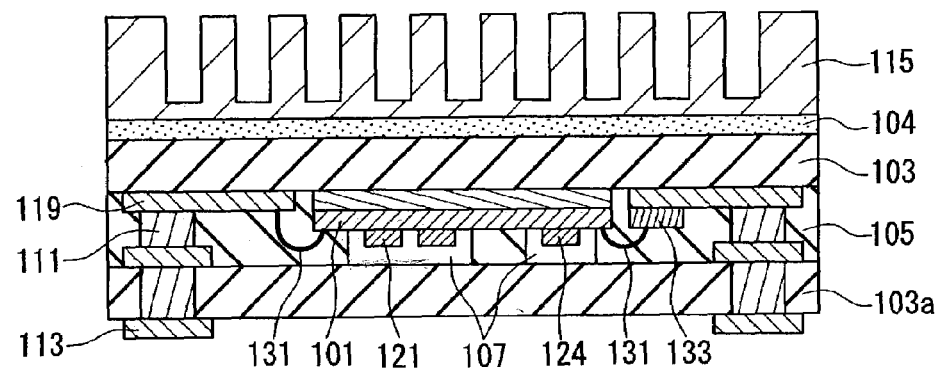
FIG. 4 is a cross-sectional view schematically showing a semiconductor built-in millimeter-wave band module according to Embodiment 3 of the present invention.

FIG. 4 is a cross-sectional view schematically showing a configuration of a semiconductor built-in millimeter-wave band module according to Embodiment 3 of the present invention.

The following describes the semiconductor built-in millimeter-wave band module of this embodiment, with reference to FIG. 4. In FIG. 4, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On both sides of an insulating substrate 105, a first and a second high thermal conductivity substrate 103 and 103a are provided, where a wiring pattern 119 provided on the first high thermal conductivity substrate 103 is connected electrically with an external electrode 113 through a via conductor 111 and a via conductor provided in the lower high thermal conductivity substrate 103a as the second high thermal conductivity substrate. On an outer surface of the first high thermal conductivity substrate 103, a heat sink 115 is mounted to dissipate heat via a thermal conductive adhesive 104.

A void 107 is formed at regions in the vicinity of a distributed constant circuit element 121 and an active element 124 formed on the semiconductor device 101. A side of the void that is opposed to the semiconductor device 101 is formed to contact with the high thermal conductivity substrate, and sidewalls of the void are formed to contact with the insulating substrate 105 made of a mixture containing an inorganic filler and a thermosetting resin. That is, the void 107 has a shape to penetrate through the insulating substrate 105.

Embodiment 4

Figure 5:
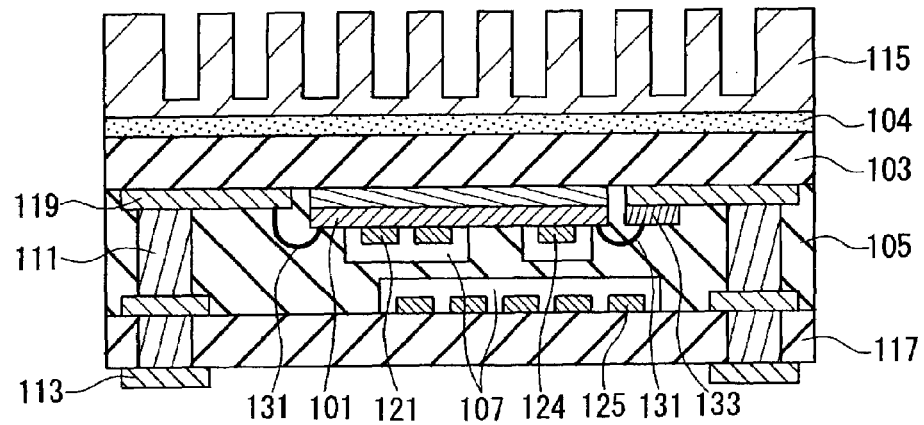
FIG. 5 is a cross-sectional view schematically showing a semiconductor built-in millimeter-wave band module according to Embodiment 4 of the present invention.

FIG. 5 is a cross-sectional view schematically showing a configuration of a semiconductor built-in millimeter-wave band module according to Embodiment 4 of the present invention.

The following describes the semiconductor built-in millimeter-wave band module of this embodiment, with reference to FIG. 5. In FIG. 5, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, a distributed constant circuit element 121 is formed in addition to an active element 124. Additionally, on a low dielectric loss substrate 117, a wiring pattern and a filter element 125 formed with a wiring pattern are formed.

The low dielectric loss substrate 117 and the high thermal conductivity substrate 103 are laminated with an insulating substrate 105 made of a mixture containing an inorganic filler and a thermosetting resin inserted therebetween. The wiring provided on the low dielectric loss substrate 117 and the wiring provided on the high thermal conductivity substrate 103 are connected electrically with each other through a via conductor 111 provided in the insulating substrate 105.

A void 107 is formed at regions in the vicinity of a distributed constant circuit element 121 formed with the wiring pattern and an active element 124 formed on the semiconductor device 101 or a region in the vicinity of the filter element 125. On an outer surface of the high thermal conductivity substrate 103, a heat sink 115 is mounted to dissipate heat via a thermal conductive adhesive 104.

One example of a method for manufacturing the semiconductor built-in millimeter-wave band module of the present invention will be described below, with reference to FIGS. 6A to 6F. FIGS. 6A to 6F are cross-sectional views showing one embodiment of the manufacturing process of the semiconductor built-in millimeter-wave band module.

Figure 6A:
FIGS. 6A to 6F are cross-sectional views schematically showing a method of manufacturing the semiconductor built-in millimeter-wave band module according to Embodiment 4 of the present invention.

Firstly, three sheet members 150a are manufactured according to the method described in Embodiment 1 (FIG. 6A). First through holes 140 are formed in the first sheet member 150b, which is one of the three sheet members, at regions in the vicinity of the active element and the distributed constant circuit element formed with the wiring pattern on the semiconductor device.

Figure 6B:
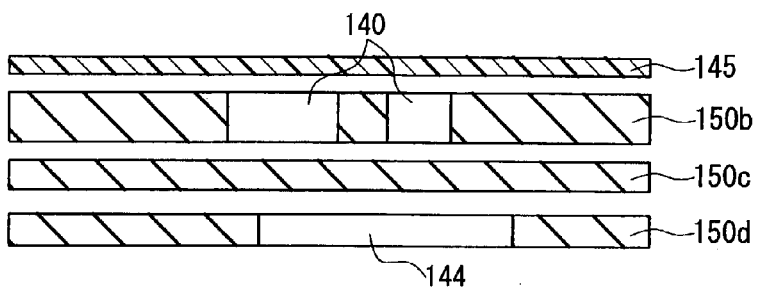

Next, a third through hole 144 is formed in the second sheet member 150d at regions in the vicinity of the filter elements provided on the low dielectric loss substrate when laminating them. Next, the first and the second sheet members and the remaining third sheet member 150c that has no through holes formed therein are aligned and overlaid with one another so that the third sheet member 150c is located between the first and the second sheet member, and a resin film 145 made of polyethylene terephthalate, etc. further is overlaid on the outside of the lamination, followed by the application of pressure to be integrated (FIG. 6B).

Figure 6C:
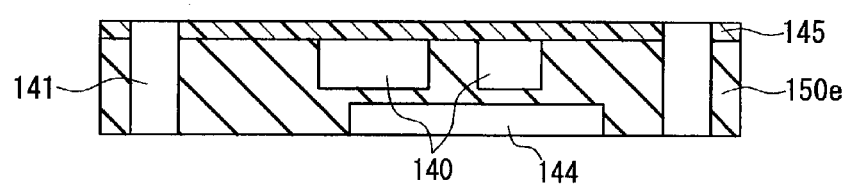

Thereafter, as shown in FIG. 6C, a second through hole 141 is formed at a desired position of the thus integrated sheet member 150e, so that a sheet member is formed to have the second through hole 141 formed therein. The second through hole is formed in the same manner as in the first through hole.

Figure 6D:
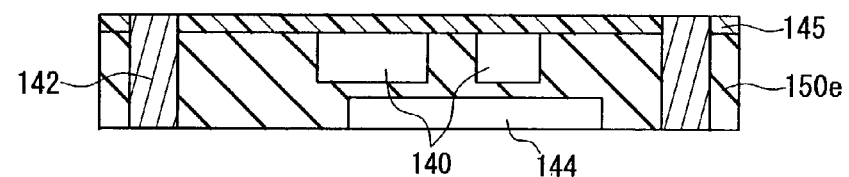

Thereafter, as shown in FIG. 6D, the second through hole 141 is filled with a conductive resin composition 142 so as to form a sheet member 150e with the second through hole 141 filled with the conductive resin composition 142.

Figure 6E:
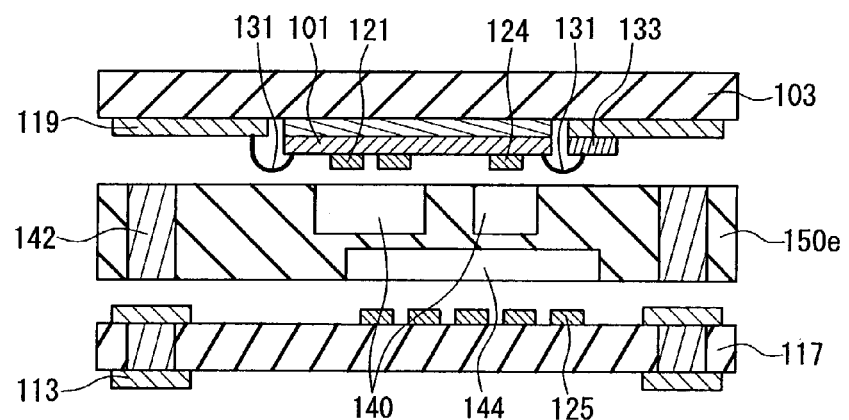

In parallel with the steps of FIGS. 6A to 6D, as shown in FIG. 6E, a wiring pattern 119 is formed on the high thermal conductivity substrate 103 made of AlN and the like and a semiconductor device 101 made of GaAs, InP and the like is die-bonded thereon, and wire-bonding is provided by means of a wire 131. Also, the semiconductor device 101 and the bypass capacitor 133 are connected electrically with each other by means of wire bonding via a wire 131. Additionally, a distributed constant circuit element 121 and an active element 124 are die-bonded onto the semiconductor device 101.

Thereafter, the high thermal conductivity substrate 103 with the semiconductor device 101 mounted thereon, the sheet member of FIG. 6D, and the low dielectric loss substrate 117 with the filter elements 125, the wiring 113 and the via conductor formed thereon (therein) are aligned and overlaid with one another.

The low dielectric loss substrate 117 is formed with the above-described ceramic material and heat resistant resin, and a preferable thickness is in a range of 0.1 mm to 1 mm.

Figure 6F:
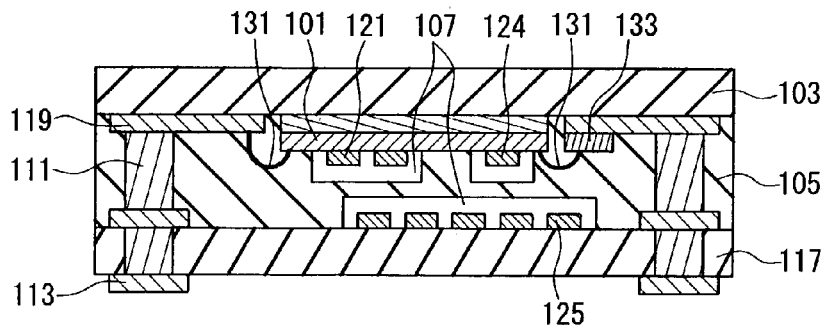

Thereafter, as shown in FIG. 6F, they are aligned and overlaid, and heat and pressure are applied thereto, for example, using hot pressing at a pressing temperature of 120° C. and pressure of $9.8 \times 10^5$ Pa for 5 minutes. Thereby, a sheet member in which the semiconductor device 101 is embedded is formed. Subsequently, heat is applied thereto to cure the thermosetting resins contained in the sheet member and the conductive resin composition As a result, a sheet member 105 in which the semiconductor device 101 is embedded and the voids 107 are formed at regions in the vicinity of the active element 124 and the distributed constant circuit element 121 formed with the wiring pattern on the semiconductor device and a region in the vicinity of a region where the filter element 125 is formed on the low dielectric loss substrate 117. The heat is applied at a temperature not less than a curing temperature of the thermosetting epoxy resin contained in the sheet members 150a to 150e and the conductive resin composition 142 (e.g., 150° C. to 260° C.), thus rendering the sheet member into an insulating substrate 105 and the conductive resin composition into the via conductor 111. As a result of this procedure, the low dielectric loss substrate, the high thermal conductivity substrate 103 and the insulating substrate 105 are bonded mechanically and firmly.

Heat generated from the active element on the surface of the semiconductor device in the thus configured semiconductor built-in millimeter-wave band module is dissipated from the semiconductor device via the bonding agent for die-bonding and the high thermal conductivity substrate. By bonding the semiconductor device to the high thermal conductivity substrate having a thermal conductivity higher than that of the insulating substrate, a heat dissipation path can be expanded into the planar surface direction, thus reducing the substantial heat resistance. Then, in this case, by bonding a heat sink to the high thermal conductivity substrate to which a rear face of the semiconductor device is die-bonded, the heat path can be shortened as compared with the configuration where the high thermal conductivity substrate is mounted on a mother board and the mother board and the heat sink are bonded to each other, thus decreasing the heat resistance, so that heat can be dissipated effectively.

In addition, by integrating the heat sink with the casing in which the semiconductor built-in millimeter-wave band module is mounted, the component cost and the assembly cost can be reduced.

Moreover, electrical wiring can be arranged freely, and the high frequency characteristics of the semiconductor device equivalent to those in a bare chip state can be obtained. In addition, although the filter element is included therein, since the void is formed at a region in the vicinity of the filter element, the filter element is free from the influence by the resin composition constituting the insulating substrate for embedding the filter elements therein. Therefore, a filter element with low loss can be included therein, so that the semiconductor device can be connected therewith in the shortest distance, which can reduce a loss due to the connection.

Embodiment 5

Figure 7:
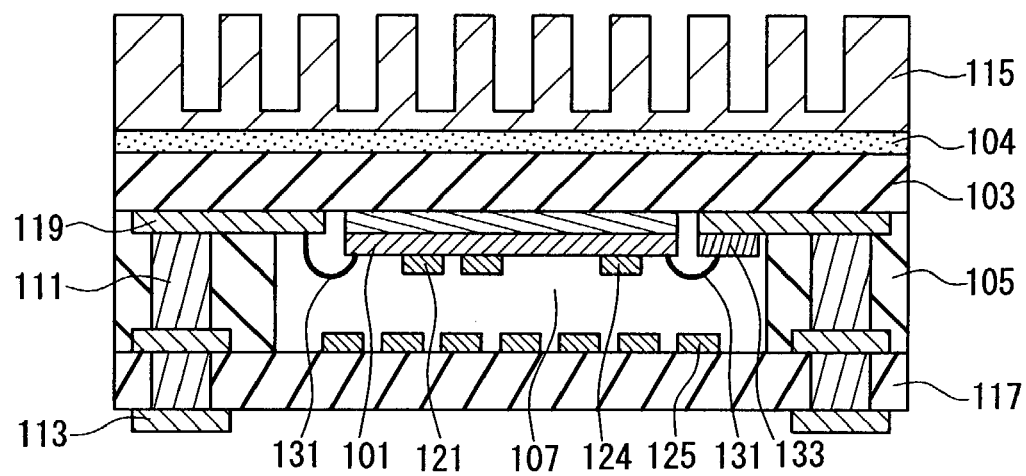
FIG. 7 is a cross-sectional view schematically showing a semiconductor built-in millimeter-wave band module according to Embodiment 5 of the present invention.

FIG. 7 is a cross-sectional view schematically showing a configuration of a semiconductor built-in millimeter-wave band module according to Embodiment 5 of the present invention.

The following describes the semiconductor built-in millimeter-wave band module of this embodiment, with reference to FIG. 7. In FIG. 7, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, a distributed constant circuit element 121 is formed in addition to an active element 124. Additionally, on a low dielectric loss substrate 117, a wiring pattern and a filter element 125 formed with a wiring pattern are formed. On the outside of the low dielectric loss substrate 117, an external electrode 113 is formed to be connected with a conductive via.

The low dielectric loss substrate 117 and the high thermal conductivity substrate 103 are laminated with an insulating substrate 105 made of a mixture containing an inorganic filler and a thermosetting resin inserted therebetween. The wiring provided on the low dielectric loss substrate 117 and the wiring provided on the high thermal conductivity substrate 103 are connected electrically with each other through a via conductor 111 provided in the insulating substrate 105. On an outer surface of the high thermal conductivity substrate 103, a heat sink 115 is mounted to dissipate heat via a thermal conductive adhesive 104.

A void 107 is formed at regions in the vicinity of a distributed constant circuit element 121 formed with the wiring pattern and an active element 124 formed on the semiconductor device 101 or a region in the vicinity of the filter element 125. In one void, the distributed constant circuit element 121 and the active element 124 formed on the semiconductor device 101 and the filter element 125 provided on the low dielectric loss substrate 117 at a different layer are provided, and the void 107 in which the distributed constant circuit element 121, the active element 124 and the filter element 125 are provided is provided in the insulating substrate in which a single through hole is formed. That is to say, unlike the configuration shown in FIG. 5, the void in the vicinity of the distributed constant circuit element doubles as the void in the vicinity of the filter element.

According to the thus configured semiconductor built-in millimeter-wave band module, in the process of manufacturing the semiconductor built-in millimeter-wave band module according to this embodiment, when the sheet member described in the manufacturing method of Embodiment 4 is manufactured in which the first through hole for forming the void is formed and the second through hole is filled with the conductive resin composition as shown in FIG. 6D, such a sheet member can be manufactured by forming the second through hole in one mixture 150, filling the second through hole with the conductive resin composition, and then forming the first through hole for forming the void, so that the semiconductor built-in millimeter-wave band module can be manufactured more easily so as to include the semiconductor and the filter element therein.

Embodiment 6

Figure 8:
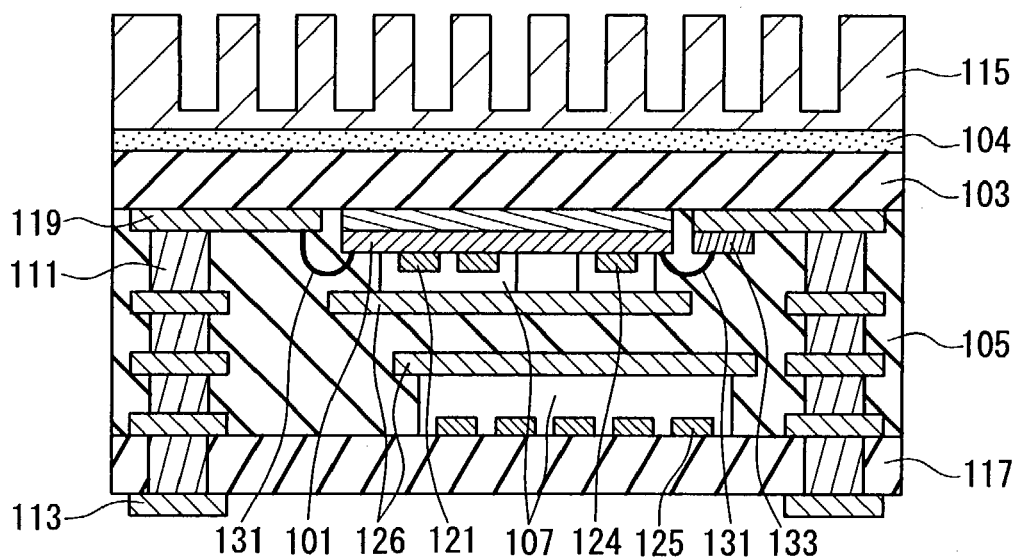
FIG. 8 is a cross-sectional view schematically showing a semiconductor built-in millimeter-wave band module according to Embodiment 6 of the present invention.

FIG. 8 is a cross-sectional view schematically showing a configuration of a semiconductor built-in millimeter-wave band module according to Embodiment 6 of the present invention.

The following describes the semiconductor built-in millimeter-wave band module of this embodiment, with reference to FIG. 8. In FIG. 8, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, in addition to active elements, distributed constant circuit elements 121 formed with patterns such as a matching circuit using a wiring for connecting the active elements and a stub, a coupled line, a filter and a stub for bypass, a capacitor and an inductor are formed. Additionally, on a low dielectric loss substrate 117, a wiring pattern and a filter element 125 formed with a wiring pattern are formed. On the outside of the low dielectric loss substrate 117, an external electrode 113 is formed to be connected with a conductive via. The low dielectric loss substrate 117 and the high thermal conductivity substrate 103 are laminated with an insulating substrate 105 made of a mixture containing an inorganic filler and a thermosetting resin inserted therebetween. The wiring provided on the low dielectric loss substrate 117 and the wiring provided on the high thermal conductivity substrate 103 are connected electrically with each other through a via conductor 111 provided in the insulating substrate 105. On an outer surface of the high thermal conductivity substrate 103, a heat sink 115 is mounted to dissipate heat via a thermal conductive adhesive 104.

A void 107 is formed at regions in the vicinity of a distributed constant circuit element 121 formed with the wiring pattern and an active element 124 formed on the semiconductor device 101 or a region in the vicinity of the filter element 125 provided on the low dielectric loess substrate. The opening of the void 107 at a surface opposite the surface in the vicinity of the distributed constant circuit element 121, the active element 124 and the filter element 125 is closed with a shield conductor 126.

As the shield conductor 126, a metal can be used, and especially metal foil is preferable. In this embodiment, copper foil is used as the shield conductor.

Note here the above-described use of the shield conductor is not limited to this embodiment, and the shield conductor is applicable to the above-described and the following embodiments also.

According to the thus formed semiconductor built-in millimeter-wave band module, the shield conductor can prevent the leakage of a signal between the semiconductor device and the filter element, in addition to the effects described in Embodiment 4. Also, the deformation of the shape of the void due to the softening of the resin, which might occur in a void formation step during the manufacturing process of the semiconductor built-in millimeter-wave band module, can be reduced. In addition, by electrically connecting the shield conductor with a grounding terminal, the characteristics of the filter element can be improved. For instance, the filter characteristics having steep damping characteristics can be obtained.

Embodiment 7

Figure 9:
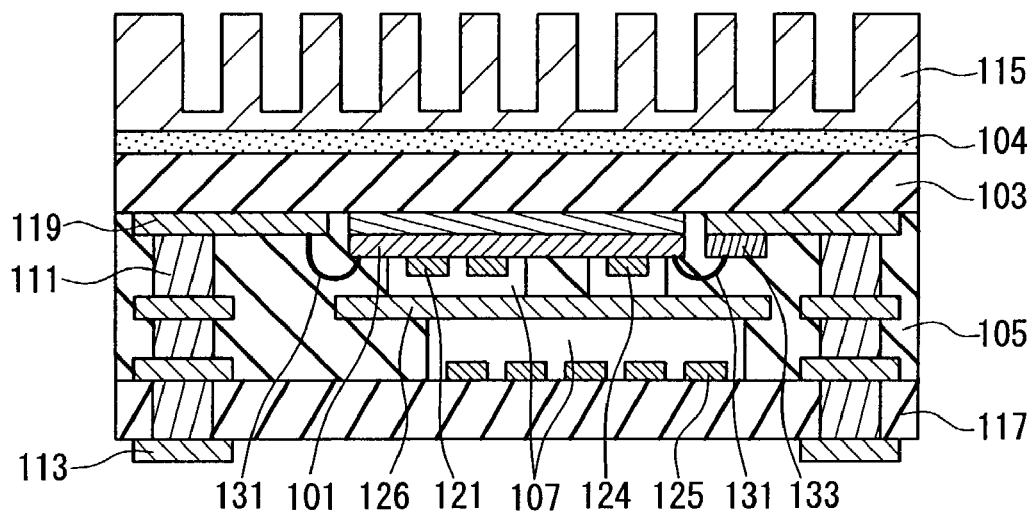
FIG. 9 is a cross-sectional view schematically showing a semiconductor built-in millimeter-wave band module according to Embodiment 7 of the present invention.

FIG. 9 is a cross-sectional view schematically showing a configuration of a semiconductor built-in millimeter-wave band module according to Embodiment 7 of the present invention.

The following describes the semiconductor built-in millimeter-wave band module of this embodiment, with reference to FIG. 9. In FIG. 9, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, in addition to an active element 124, a distributed constant circuit element 121 is formed. Additionally, on a low dielectric loss substrate 117, a wiring pattern and a filter element 125 formed with a wiring pattern are formed. The low dielectric loss substrate 117 and the high thermal conductivity substrate 103 are laminated with an insulating substrate 105 made of a mixture containing an inorganic filler and a thermosetting resin inserted therebetween. The wiring 113 provided on the low dielectric loss substrate 117 and the wiring 119 provided on the high thermal conductivity substrate 103 are connected electrically with each other through a via conductor 111 provided in the insulating substrate 105 and a via conductor provided in the low dielectric loss substrate 117. On an outer surface of the high thermal conductivity substrate 103, a heat sink 115 is mounted to dissipate heat via a thermal conductive adhesive 104.

A void 107 is formed at regions in the vicinity of the distributed constant circuit element 121 formed with the wiring pattern and the active element 124 formed on the semiconductor device 101 or a region in the vicinity of the filter element 125. On a side of the void 107 that is opposed to the surface in the vicinity of the distributed constant circuit element 121, the active element 124 and the filter element 125, a common shield conductor 126 is formed. The voids formed at a different layer contact with the same shield conductor 126 at a surface and a rear face thereof. In this way, the voids share the shield conductor with one another.

According to the thus configured semiconductor built-in millimeter-wave band module, the number of layers in the insulating substrate can be reduced when manufacturing the semiconductor built-in millimeter-wave band module in Embodiment 6, thus facilitating the manufacturing of the same.

Embodiment 8

Figure 10:
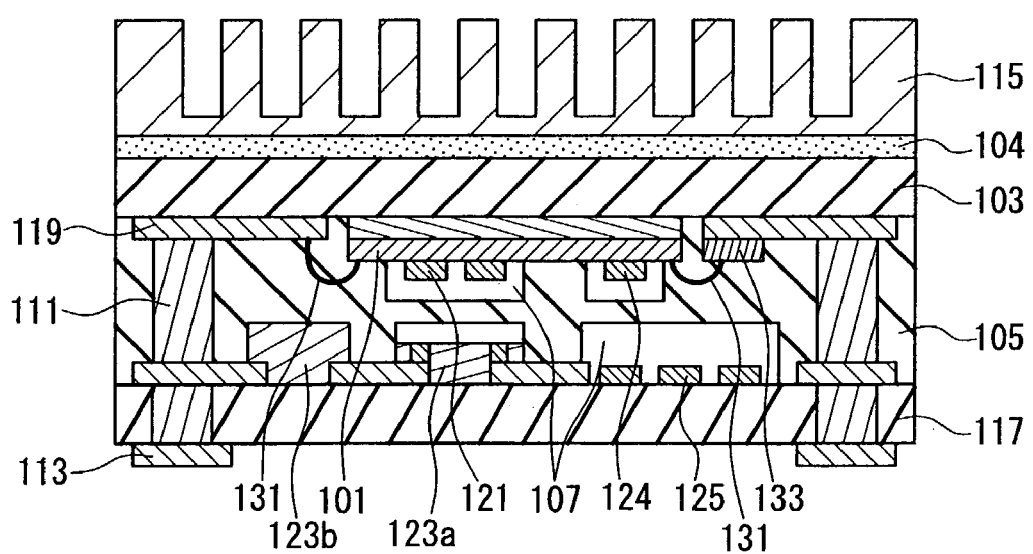
FIG. 10 is a cross-sectional view schematically showing a semiconductor built-in millimeter-wave band module according to Embodiment 8 of the present invention.

FIG. 10 is a cross-sectional view schematically showing a configuration of a semiconductor built-in millimeter-wave band module according to Embodiment 8 of the present invention.

The following describes the semiconductor built-in millimeter-wave band module of this embodiment, with reference to FIG. 10. In FIG. 10, a semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, in addition to an active element 124, a distributed constant circuit element 121 is formed Additionally, on a low dielectric loss substrate 117, a wiring pattern and a filter element 125 formed with a wiring pattern are formed. Circuit components 123a and 123b electrically connected with the wiring pattern on the low dielectric loss substrate 117 are arranged in an insulating substrate 105.

The low dielectric loss substrate 117 and the high thermal conductivity substrate 103 are laminated with the insulating substrate 105 made of a mixture containing an inorganic filler and a thermosetting resin inserted therebetween. The wiring 113 provided on the low dielectric loss substrate 117 and the wiring 119 provided on the high thermal conductivity substrate 103 are connected electrically with each other through a via conductor 111 provided in the insulating substrate 105 and a via conductor provided in the low dielectric loss substrate 117. On an outer surface of the high thermal conductivity substrate 103, a heat sink 115 is mounted to dissipate heat via a thermal conductive adhesive 104.

A void 107 is formed at regions in the vicinity of the distributed constant circuit element 121 formed with the wiring pattern and the active element 124 formed on the semiconductor device 101 or a region in the vicinity of the filter element 125 provided on the low dielectric constant.

On the other hand, the circuit components 123a and 123b mounted on the low dielectric loss substrate 117 contact with the insulating substrate 105 to be embedded therein.

The circuit components, for example, include an active component 123a and a passive component 123b. As the active component 123a, for example, a semiconductor device such as a transistor, an IC and an LSI can be used. The semiconductor device may be a semiconductor bare chip. As the passive component 123b, a chip resistor, a chip capacitor or a chip inductor can be used. The circuit components may not include the passive component 123b.

The active component 123a can be connected to the wiring pattern by well-known flip chip bonding. The via conductor 111 is formed of, for example, a thermosetting conductive substance. For example, a conductive resin composition containing metal particles and a thermosetting resin can be used for the thermosetting conductive substance. Examples of the metal particles include gold, silver, copper and nickel. Gold, silver, copper and nickel are preferable because of their high conductivity. Among them, copper is most preferable because of its especially high conductivity and small migration. As for the thermosetting resin, for example, an epoxy resin, a phenol resin or a cyanate resin can be used. An epoxy resin is most preferable because of its high heat resistance.

A sealing resin may be injected between the circuit component mounted on the low dielectric loss substrate 117 and the low dielectric loss substrate 117. Also in the following embodiments, a sealing resin may be injected between a circuit component and a copper foil or a circuit component and a wiring pattern. An underfill resin, which is used for general flip chip bonding, can be used for the sealing resin.

According to the thus configured semiconductor built-in millimeter-wave band module, since further circuit components are included therein, the connecting distance between the semiconductor device and the circuit component can be made much shorter. Thereby, a semiconductor built-in millimeter-wave band module with excellent high-frequency characteristics such as a reduced noise in the electric signal can be obtained. In addition, since the circuit components whose properties are guaranteed beforehand are included therein, a module with a high yield during the manufacturing process and with a high reliability can be realized.

Note here that although this embodiment describes one example where further circuit components are included in the insulating substrate, such a configuration is applicable to the other embodiments.

Embodiment 9

This embodiment describes one example of a semiconductor built-in millimeter-wave band module having a multilayered structure according to the present invention.

Figure 11:
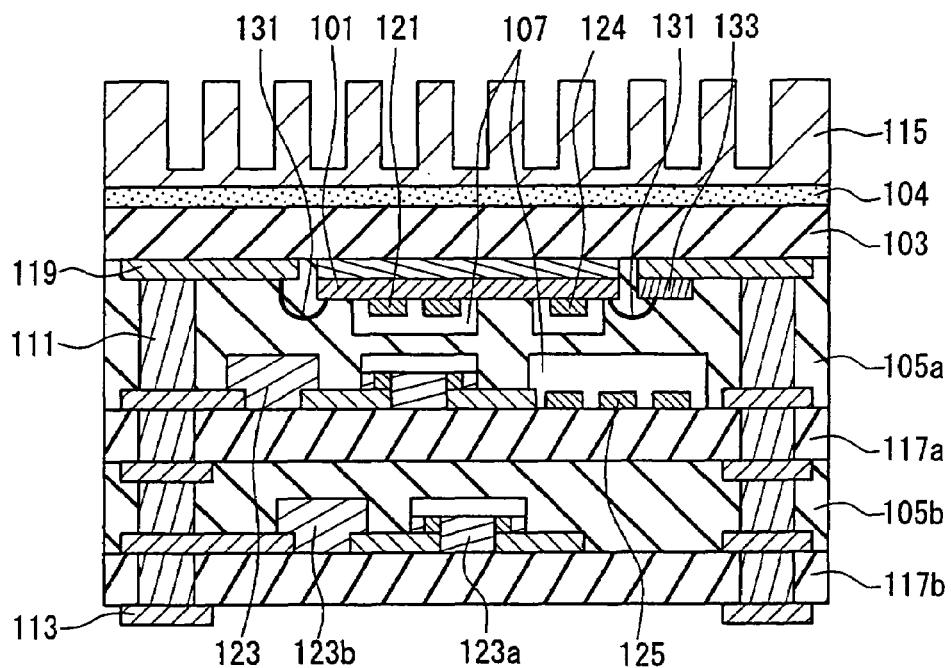
FIG. 11 is a cross-sectional view schematically showing a semiconductor built-in millimeter-wave band module according to Embodiment 9 of the present invention.

FIG. 11 is a cross-sectional view of the semiconductor built-in millimeter-wave band module of Embodiment 9.

The semiconductor built-in millimeter-wave band module according to this embodiment includes: a high thermal conductivity substrate 103; a semiconductor device 101 packaged on the high thermal conductivity substrate 103 in a face-up manner; and a plurality of low dielectric loss substrates (a first and a second low dielectric loss substrates 117a and 117b) 117. A circuit component 123 is mounted on the low dielectric loss substrate 117a, and circuit components 123a and 123b are mounted on the low dielectric loss substrate 117b. A first and a second insulating substrate 105a and 105b are laminated among the high thermal conductivity substrate 103 and the plurality of low dielectric loss substrates 117a and 117b. A distributed constant circuit element 121 is mounted on the semiconductor device 101 on the high thermal conductivity substrate 103 and in the first insulating substrate 105a, and an active element 124 is mounted on the high thermal conductivity substrate 103. A void 107 is provided on an outer surface of each of the distributed constant circuit element 121 and the active element 124. Similarly, a filter element 125 is formed on the low dielectric loss substrate 117a and a void 107 is formed on an outer surface of the filter element 125. The circuit component 123b is mounted on the low dielectric loss substrate 117b and a void 107 is formed on an outer surface of the circuit component 123a.

The insulating substrates 105a and 105b are made of a mixture containing an inorganic filler and a thermosetting resin. As the inorganic filler, for example, $Al_2O_3$, BeO, BN, SiC, AlN and $SiO_2$ can be used. It is preferable that the inorganic filler is contained in a range of 70 weight % to 95 weight %, inclusive, with reference to the mixture. It is preferable that an average particle diameter of the inorganic filler is in a range of 0.1 µm to 100 µm, inclusive. As the thermosetting resin, for example, an epoxy resin, a phenol resin and a cyanate resin with high heat resistance are preferable. The epoxy resin is much preferable because of especially high heat resistance. The mixture further may contain a dispersing agent, a coloring agent, a coupling agent or a releasing agent.

The circuit components 123, for example, include an active component 123a and a passive component 123b. As the active component 123a, for example, a semiconductor device such as a transistor, an IC and an LSI can be used. The semiconductor device may be a semiconductor bare chip. As the passive component 123b, a chip resistor, a chip capacitor or a chip inductor can be used. The circuit components 123 may not include the passive component 123b.

The active component 123a is connected to the low dielectric loss substrate 117 by, for example, flip chip bonding. The semiconductor built-in millimeter-wave band module shown in FIG. 11 has a three layered structure, but can have a multilayered structure depending on the design.

In this embodiment, the circuit component should be embedded in at least the second insulating substrate, and circuit components may be embedded further in the first insulating substrate.

According to the thus configured semiconductor built-in millimeter-wave band module, heat from the semiconductor device can be dissipated effectively, properties equivalent to those in a bare chip state can be obtained, the semiconductor device can be connected to the filter with low loss using the short wiring, excellent high frequency characteristics are realized and a high yield during the manufacturing process and high reliability can be realized. In addition to these, the length of the wiring between the circuit components mounted on the plurality of low dielectric loss substrates and the semiconductor device or the filter element can be made significantly shorter as compared with the case where the low dielectric loss substrates are not laminated into a multilayer structure but arranged two-dimensionally. Therefore, a loss in the signal due to the wiring can be reduced, and a mounting area of the module with the same function can be reduced and miniaturized so that circuit components can be packaged densely.

Embodiment 10

This embodiment describes another example of a semiconductor built-in millimeter-wave band module having a multilayered structure according to the present invention.

Figure 12:
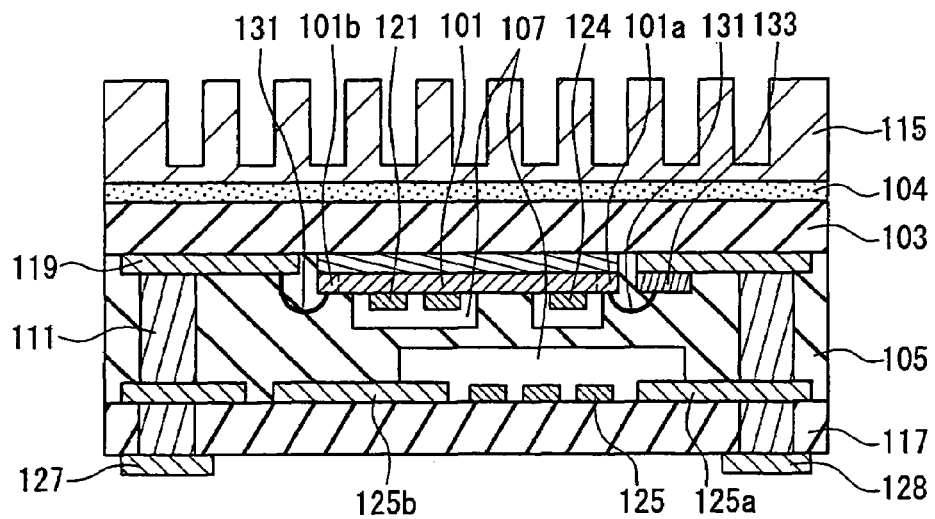
FIG. 12 is a cross-sectional view schematically showing a semiconductor built-in millimeter-wave band module according to Embodiment 10 of the present invention.
Figure 13:
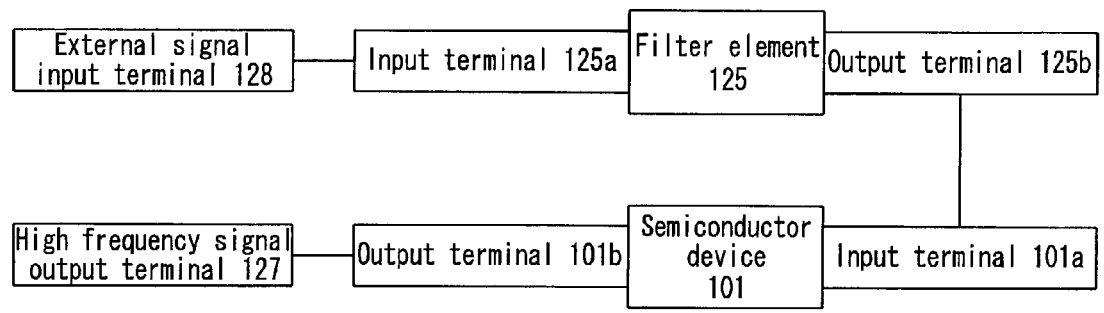
FIG. 13 schematically shows a circuit of the semiconductor built-in millimeter-wave band module according to Embodiment 10 of the present invention.

FIG. 12 is a cross-sectional view of the semiconductor built-in millimeter-wave band module of Embodiment 10, and FIG. 13 schematically shows a circuit configuration of the same.

A semiconductor device 101 is packaged on a high thermal conductivity substrate 103 in a face-up manner and is connected electrically with a wiring pattern 119 formed on the high thermal conductivity substrate 103 and a bypass capacitor 133 mounted on the wiring pattern 119 by means of wire bonding via a wire 131.

On the semiconductor device 101, in addition to active element 124, a distributed constant circuit element 121 is formed.

Additionally, on a low dielectric loss substrate 117, a wiring pattern and a filter element 125 formed with a wiring pattern are formed. The low dielectric loss substrate 117 and the high thermal conductivity substrate 103 are laminated with an insulating substrate 105 made of a mixture containing an inorganic filler and a thermosetting resin inserted therebetween. The wiring provided on the low dielectric loss substrate 117 and the wiring provided on the high thermal conductivity substrate 103 are connected electrically with each other through a via conductor 111 provided in the insulating substrate 105.

A void 107 is formed at regions in the vicinity of the distributed constant circuit element 121 formed with the wiring pattern and the active element 124 formed on the semiconductor device 101 or a region in the vicinity of the filter element 125 provided on the low dielectric constant. On an outer surface of the high thermal conductivity substrate 103, a heat sink 115 is mounted to dissipate heat via a thermal conductive adhesive 104.

A high frequency signal output terminal 127 and an external signal input terminal 128 each are a part of the wiring pattern, and are provided on a surface of the low dielectric loss substrate 117. These high frequency signal output terminal 127 and external signal input terminal 128 may be provided on the high thermal conductivity substrate 103.

The external signal input terminal 128 is connected electrically with an input terminal 125a of a filter element 125 through the wiring pattern, a via conductor and the like, and an output terminal 125b of the filter element 125 is connected electrically with an input terminal 101a of the semiconductor device 101. Then, an output terminal 101b of the semiconductor device 101 is connected electrically with the high frequency signal output terminal 127. These electric connection relationship are illustrated in FIG. 13. As illustrated in FIG. 13, the elements are designed to be connected electrically with one another in the semiconductor millimeter-wave band module so as to perform as one module.

In the thus configured semiconductor built-in millimeter-wave band module, in the case of the semiconductor device being a power amplifier for high output, a transmission module can be obtained so that the semiconductor built-in millimeter-wave band module realizes one integral transmission function, whereby the number of components constituting a communication instrument handling millimeter-wave band signals can be reduced.

In the case of the semiconductor device being a low-noise amplifier, a receiving module can be obtained similarly. In addition, according to the semiconductor built-in millimeter-wave band module using a plurality of semiconductor devices, a millimeter-wave band front end module with an integrated transmission/reception function can be obtained.

Figure 16:
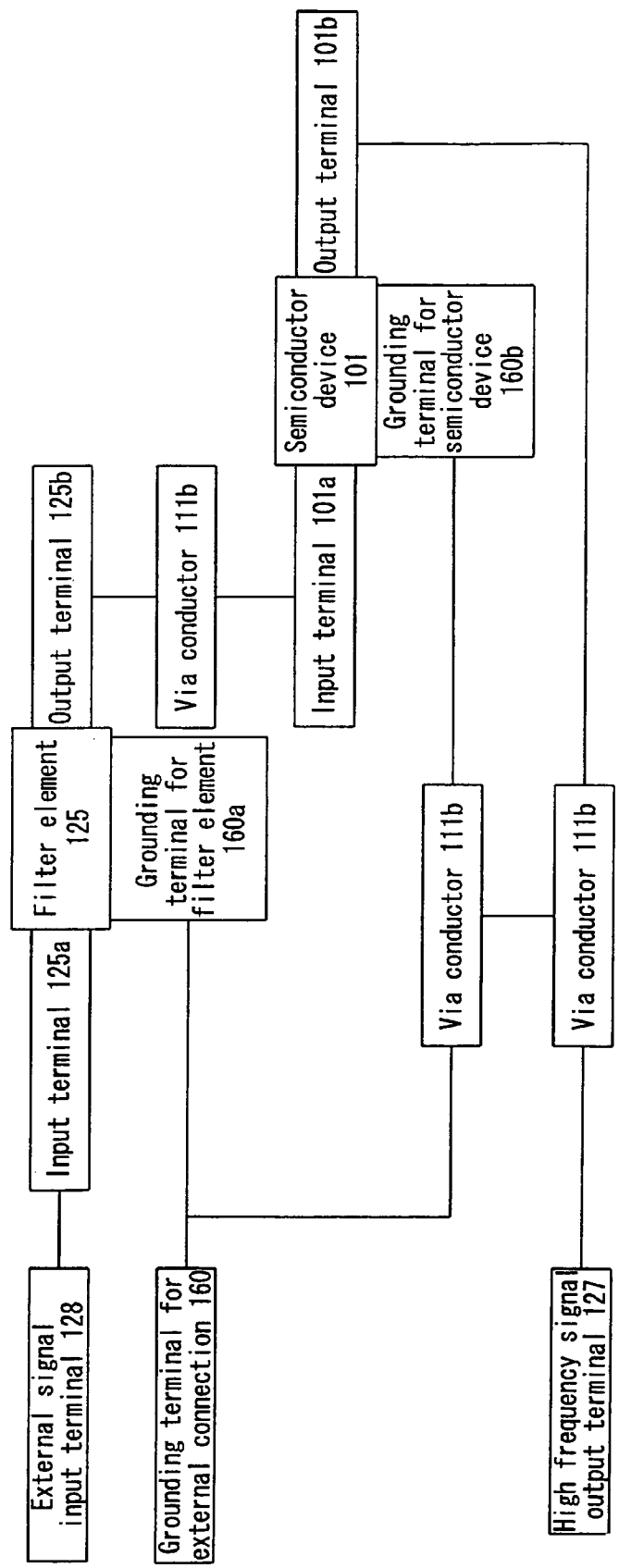
FIG. 16 schematically shows a circuit of the semiconductor built-in millimeter-wave band module according to Embodiment 10 of the present invention.

For instance, as shown in the schematic view of FIG. 16 showing one example of another circuit configuration of the semiconductor built-in millimeter-wave band module, a grounding terminal for external connection 160 is connected electrically with a grounding terminal for filter element 160a of a filter element 125 via a wiring pattern and a via conductor and is further connected electrically with the grounding terminal for filter terminal 160a and a grounding terminal for semiconductor device 160b via the via conductor 111b and the wiring pattern and the like. As the filter element, for example, a microstrip bandpass filter using a coupled line can be used. In this case, wiring constituting a filter is formed on a low dielectric loss substrate, and an electrode on the opposite rear face of the low dielectric loss substrate serves as a grounding layer for the filter element and a portion of the grounding layer becomes a grounding terminal for filter element. The grounding terminal for filter element is connected with the grounding terminal for semiconductor device via a through hole provided in the low dielectric loss substrate, a via conductor provided in the insulating substrate and the wiring pattern on the high thermal conductivity substrate.

In this way, by connecting the grounding terminal for filter element 160a and the grounding terminal for semiconductor device 160b are connected in the shortest distance using the plurality of via conductors 111b provided in the insulating substrate 105, the grounding terminals of the filter element 125 and the semiconductor device 101 can function as the grounding terminal with stability even at high frequencies, thus realizing a stable operation.

Note here that each substrate of the above-described embodiments is not limited to a single layer substrate, and may be a multilayered wiring substrate.

Embodiment 11

This embodiment describes one example of an assembled member of a semiconductor built-in millimeter-wave band module according to the present invention.

FIG. 17 is a cross-sectional view schematically showing a configuration of the assembled member of the semiconductor built-in millimeter-wave band module of this embodiment.

In the assembled member of the semiconductor built-in millimeter-wave band module of this embodiment, the external electrodes 113 of the semiconductor built-in millimeter-wave band module described in Embodiment 1 are connected with a mother board terminal 161 using lead/tin base solder and the like. Among the external electrodes 113, a grounding electrode is connected with a mother board grounding terminal 162. As the mother board, a printed circuit board made of a fluorine resin can be used. The mother board grounding terminal 162 is connected electrically with a side of the mother board 160 opposite to the side with the semiconductor built-in millimeter-wave band module 100 being mounted thereon using a through hole 165. In addition, the mother board grounding terminal 162 is connected electrically with a lower casing 171 using a conductive adhesive 104a. The lower casing 171 is made of a metal such as aluminum-pressure die-casting, and doubles as a heat sink. The lower casing 171 is integrally fixed with an upper casing 172 and a side casing 173 by screws or the like, and has the same potential as of those casings. The upper casing 172 further is connected electrically with the high thermal conductivity substrate 103 on a rear face of which a grounding layer is formed, using an adhesive layer 104. The adhesive layer 104 may be made of the same material as of the conductive adhesive 104a. As the conductive adhesive 104 and 104a, for example, "DOHDENT"(trade name) produced by Nihon Handa Co., Ltd, having an electric conductivity of $1 \times 10^{-4}$ Ω·cm, can be used. In FIG. 17, elements with the same reference numerals as in the above embodiments have the same components, and therefore their explanation will be omitted.

According to this assembled member of the semiconductor built-in millimeter-wave band module, the heat sink and the casing can be integrated, so that the number of components can be reduced. At the same time, the commonality of the grounding electrode of the semiconductor built-in millimeter-wave band module and the grounding electrode of the mother board can be provided, whereby the commonality of their grounding potentials can be provided with stability. As a result, the built-in semiconductor device can be operated with stability.

One example of a method for manufacturing the semiconductor built-in millimeter-wave band module according to the present invention will be described below. The external electrode 113 of the semiconductor built-in millimeter-wave band module is mounted on the mother board by printing a cream solder on the mother board terminal 161, followed by reflowing. Subsequently, the conductive adhesive is applied at a predetermined position of the lower casing using a dispenser, and the mother board is mounted thereon, where the semiconductor built-in millimeter-wave band module has been mounted on the mother board. Thereafter, the adhesive layer is applied at a predetermined position of the upper casing by a dispenser, and the lower casing and the upper casing are secured to the side casings by screws. In this step, simultaneously, the upper casing is bonded to the high thermal conductivity substrate via the adhesion layer. As the adhesion layer, a film form thermoplastic sheet having compressibility can be used, for example including a thermoplastic elastic polymer exhibiting elasticity like a rubber at about a room temperature. In order to enhance the thermal conductivity, an electric conductive and thermal conductive filler is dispersed in the sheet. As the filler, silver, carbon black, graphite and the like can be used. In the case of using silver as the filler, a specific gravity of the thermoplastic elastic polymer become about 3 to 4, and the volume resistivity becomes about $10^{-3}$ Ω·cm or less. In this case, before the upper casing and the lower casing are secured, the total of the thicknesses of the semiconductor built-in millimeter-wave band mounted on the mother board, including the thickness of the mother board, the conductive adhesion layer and the thermoplastic sheet adhesion layer, is made thicker than the thickness of the side casing. Then, by using a sheet exhibiting compressibility as the adhesive layer when the upper casing the lower casing are secured to the side casing, the filler in the film of the adhesion layer is compressed, so that the filling density of the filler increases, thus increasing the electric conductivity as compared with the state before the compression and at the same time increasing the thermal conductivity.

Figure 18:
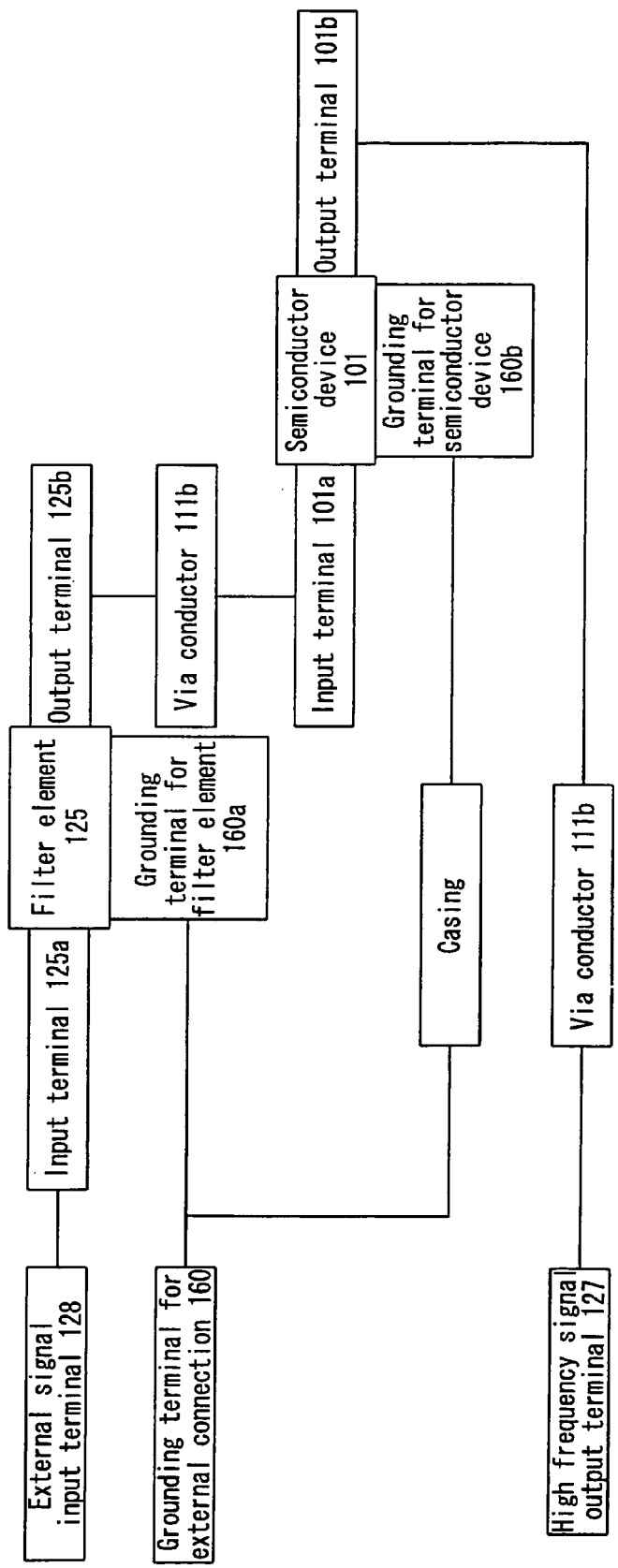
FIG. 18 schematically shows a circuit of the semiconductor built-in millimeter-wave band module according to Embodiment 11 of the present invention.

The following describes a circuit configuration in the case where the assembled member comprising the semiconductor built-in millimeter-wave band module including the filter element formed with the wiring pattern on the low dielectric loss substrate therein, which is mounted on the mother board, and the casing are connected electrically with each other, with reference to FIG. 18.

A high frequency signal output terminal 127 and an external signal input terminal 128 each are a part of the wiring pattern, and are provided on the low dielectric loss substrate 117. The external signal input terminal 128 is connected electrically with an input terminal 125a of a filter element 125 via a wiring pattern, a via conductor and the like. In addition, an output terminal 125b of the filter element 125 and an input terminal 101a of the semiconductor device 101 are connected electrically with each other via a via conductor provided in an insulating substrate and a wiring pattern. An output terminal 101b of the semiconductor device 101 is connected electrically with the high frequency signal output terminal 127.

On the other hand, a grounding terminal for external connection 160 is connected electrically with a grounding terminal for filter element 160a via a wiring pattern and a via conductor, and further is connected electrically with the grounding terminal for filter terminal 160a and a grounding terminal for semiconductor device 160b via a via conductor 111b, the wiring pattern and the like. As the filter element, for example, a microstrip bandpass filter using a ring resonator formed by providing a grounding layer on a rear face of the low dielectric loss substrate and forming a ring-shaped wiring pattern on the other surface can be used. In this case, wiring constituting a filter is formed on a low dielectric loss substrate, and an electrode on the opposite rear face of the low dielectric loss substrate serves as a grounding layer for the filter element and a portion of the grounding layer becomes a grounding terminal for filter element. The grounding terminal for filter element is connected electrically with the wiring pattern for the grounding provided on the high thermal conductivity substrate via the casing made of metal such as aluminum-pressure die-casting, and further is connected with the grounding terminal for semiconductor device.

In this way, by connecting the grounding terminal for filter element 160a and the grounding terminal for semiconductor device 160b via the casing, the grounding potential can be stabilized, so that the module can operate with stability.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor built-in millimeter-wave band module comprising:
    an electrical insulating substrate that is made of a mixture containing an inorganic filler and a thermosetting resin;
    a high thermal conductivity substrate that is made of a dielectric material having thermal conductivity higher than thermal conductivity of the electrical insulating substrate and is laminated on one surface of the electrical insulating substrate;
    a plurality of wiring patterns that is formed on the high thermal conductivity substrate and the electrical insulating substrate;
    a semiconductor device operating at millimeter-wave band, which is arranged inside of the electrical insulating substrate, is packaged on the high thermal conductivity substrate in a face-up manner, and is connected electrically with the wiring patterns; and
    a distributed constant circuit element and an active element that are provided on the semiconductor device,
    wherein a void with dimensions smaller than dimensions of the semiconductor device is provided inside of the electrical insulating substrate,
    the void surrounds a surface of the distributed constant circuit element or a surface of the active element,
    the void is filled with a material having a dielectric constant of substantially 1,
    the void is uniform around the distributed constant circuit element or active element, and
    a minimum space between a wall of the void and the respective distributed constant circuit element or the active element is 100 µm or more.

2. The semiconductor built-in millimeter-wave band module according to claim 1, wherein a second high thermal conductivity substrate further is laminated on the other surface of the electrical insulating substrate.

3. The semiconductor built-in millimeter-wave band module according to claim 2, wherein the void extends to the second high thermal conductivity substrate.

4. The semiconductor built-in millimeter-wave band module according to claim 1, wherein a shield electrode further is provided to close the void, at a surface opposed to the distributed constant circuit element.

5. The semiconductor built-in millimeter-wave band module according to claim 4, wherein the shield electrode is shared by a plurality of voids.

6. The semiconductor built-in millimeter-wave band module according to claim 1, further comprising a circuit component that is arranged inside of the electrical insulating substrate and is connected electrically with the wiring patterns.

7. The semiconductor built-in millimeter-wave band module according to claim 6, wherein the circuit component is isolated from outside air by the electrical insulating substrate.

8. The semiconductor built-in millimeter-wave band module according to claim 1, wherein the inorganic filler contained in the mixture constituting the electrical insulating substrate comprises at least one inorganic filler selected from the group consisting of $Al_2O_3$, BeO, BN, SiC, AlN and $SiO_2$.

9. The semiconductor built-in millimeter-wave band module according to claim 1, wherein the high thermal conductivity substrate comprises at least one type of ceramic selected from the group consisting of $Al_2O_3$, BeO, BN, SiC, AlN and SiC.

10. The semiconductor built-in millimeter-wave band module according to claim 1, wherein the semiconductor device comprises at least one semiconductor selected from the group of substances consisting of Si, GaAs, SiGe, InP and SiC.

11. The semiconductor built-in millimeter-wave band module according to claim 1, further comprising a low dielectric loss substrate on the other surface of the electrical insulating substrate, the low dielectric loss substrate being made of a material with dielectric loss lower than dielectric loss of the electrical insulating substrate.

12. The semiconductor built-in millimeter-wave band module according to claim 11, wherein a plurality of wiring patterns is formed on the low dielectric loss substrate.

13. The semiconductor built-in millimeter-wave band module according to claim 11,
    wherein a filter element is provided on the low dielectric loss substrate and inside of the electrical insulating substrate, and
    a void is provided in the vicinity of a surface of the filter element.

14. The semiconductor built-in millimeter-wave band module according to claim 13, wherein the filter element provided on the low dielectric loss substrate and the distributed constant circuit element and the active element provided on the semiconductor device are provided in a same void.

15. The semiconductor built-in millimeter-wave band module according to claim 13, further comprising a high frequency signal output terminal and an external signal input terminal on the high thermal conductivity substrate or the low dielectric loss substrate,
    wherein the external signal input terminal is connected electrically with an input terminal of the filter element,
    an output terminal of the filter element is connected electrically with an input terminal of the semiconductor device, and
    an output terminal of the semiconductor device is connected electrically with the high frequency signal output terminal.

16. The semiconductor built-in millimeter-wave band module according to claim 11, wherein the low dielectric loss substrate comprises at least one type of ceramic selected from the group consisting of $Al_2O_3$, BeO, BN, SiC, AlN and SiC.

17. The semiconductor built-in millimeter-wave band module according to claim 11, wherein the low dielectric loss substrate is a heat resistant resin with a heat distortion temperature not less than 180° C.

18. The semiconductor built-in millimeter-wave band module according to claim 17, wherein the heat resistant resin is at least one type of resin selected from the group consisting of a fluorine resin, a polyimide (PI) resin, an aramid resin including a meta group and a para group, a polyester resin, a polyamide-imide resin, a polyester-imide resin, a polyether ketone (PEK) resin, a polyether ether ketone (PEEK) resin, a polysulfone (PS) resin, a bismale-imide-triazine resin, a polyphenylene ether (PPE) resin, a polyphenylene sulfide (PPS) resin, a polybenzimidazole resin, a liquid crystal polymer and polybenzo-cyclobutene.

19. The semiconductor built-in millimeter-wave band module according to claim 1, wherein the electrical insulating substrate comprises a first and second electrical insulating substrates, the semiconductor built-in millimeter-wave band module further comprising:
 a high thermal conductivity substrate that is made of a dielectric material having thermal conductivity higher than thermal conductivity of the first electrical insulating substrate and that is laminated on one surface of the first electrical insulating substrate;
 a first and a second low dielectric loss substrate that are made of a material with dielectric loss lower than dielectric loss of the first electrical insulating substrate;
 a plurality of wiring patterns that is formed on the high thermal conductivity substrate, the first and the second electrical insulating substrates and the first and the second low dielectric loss substrates;
 a semiconductor device operating at millimeter-wave band, which is arranged inside of the first electrical insulating substrate, is packaged on the high thermal conductivity substrate in a face-up manner, and is connected electrically with the wiring patterns;
 a distributed constant circuit element and an active element that are provided on the semiconductor device,
 a void that is provided inside of the first electrical insulating substrate and in the vicinity of a surface of the distributed constant circuit element and a surface of the active element on the semiconductor device; and
 a circuit component that is arranged inside of the second electrical insulating substrate and is connected electrically with the wiring pattern on the second low dielectric loss substrate,
 wherein the first low dielectric loss substrate is laminated on the other side of the first electrical insulating substrate, and
 the second electrical insulating substrate is laminated between the first low dielectric loss substrate and the second low dielectric loss substrate.

20. The semiconductor built-in millimeter-wave band module according to claim 1, further comprising a heat sink having a heat dissipation function on an outside of the high thermal conductivity substrate.

21. The semiconductor built-in millimeter-wave band module according to claim 1, wherein the high thermal conductivity substrate is arranged in a casing, and the high thermal conductivity substrate and the casing are bonded using a thermal conductive resin, the semiconductor built-in millimeter-wave band module further comprising: a semiconductor device operating at millimeter-wave band, a rear face of the semiconductor device being mounted on a surface opposed to the bonding surface; and a mother board to which a grounding terminal of the semiconductor device is connected, wherein a grounding terminal of the mother board is connected electrically with the casing.

22. The semiconductor built-in millimeter-wave band module according to claim 21, wherein the thermal conductive resin has compressibility.

23. The semiconductor built-in millimeter-wave band module according to claim 21,
 wherein, in the casing, a low dielectric loss substrate further is provided and on the low dielectric loss substrate a filter element further is provided, the semiconductor device being mounted on the high thermal conductivity substrate,
 a high frequency signal output terminal, an external signal input terminal and a grounding terminal for external connection are provided on the high thermal conductivity substrate or the low dielectric loss substrate,
 the external signal input terminal and an input terminal of the filter element is connected electrically with each other,
 an output terminal of the filter element and an input terminal of the semiconductor device are connected electrically with each other via a first via conductor,
 an output terminal of the semiconductor device and the high frequency signal output terminal are connected electrically with each other via a second via conductor,
 the grounding terminal for external connection and a filter element grounding terminal of the filter element are connected electrically with each other, and
 a semiconductor device grounding terminal of the semiconductor device, the filter element grounding terminal and the grounding terminal for external connection are connected electrically with one another via the casing.

* * * * *